(12) United States Patent
Vimercati

(10) Patent No.: US 11,557,330 B1
(45) Date of Patent: Jan. 17, 2023

(54) DECK-LEVEL SHUNTUNG IN A MEMORY DEVICE

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/462,217

(22) Filed: Aug. 31, 2021

(51) Int. Cl.
 *G11C 11/22* (2006.01)

(52) U.S. Cl.
 CPC ........ *G11C 11/2255* (2013.01); *G11C 11/221* (2013.01); *G11C 11/2259* (2013.01); *G11C 11/2293* (2013.01)

(58) Field of Classification Search
 CPC .............. G11C 11/2255; G11C 11/221; G11C 11/2259; G11C 11/2293
 USPC ........................................................ 365/145
 See application file for complete search history.

(56) References Cited

U.S. PATENT DOCUMENTS

| | | | | |
|---|---|---|---|---|
| 10,854,265 | B2 * | 12/2020 | Toops | G11C 11/2273 |
| 11,423,967 | B1 * | 8/2022 | Dokania | G11C 11/2257 |
| 2004/0184307 | A1 * | 9/2004 | Saito | G11C 7/14 |
| | | | | 365/145 |
| 2009/0201710 | A1 * | 8/2009 | Ueda | G11C 7/14 |
| | | | | 365/210.1 |
| 2018/0331114 | A1 * | 11/2018 | Vimercati | G11C 11/2259 |
| 2020/0273865 | A1 * | 8/2020 | Manipatruni | H01L 28/90 |
| 2022/0069131 | A1 * | 3/2022 | Pesic | H01L 29/22 |

FOREIGN PATENT DOCUMENTS

CN 102194524 A * 9/2011 ........... G11C 13/004

* cited by examiner

*Primary Examiner* — Fernando Hidalgo
(74) *Attorney, Agent, or Firm* — Holland & Hart LLP

(57) ABSTRACT

Methods, systems, and devices for deck-level shunting in a memory device are described. A memory device may include memory arrays arranged in a stack of decks over a substrate, and a combination of deck selection circuitry and shunting circuitry may be distributed among the decks to leverage common substrate-based circuitry, such as logic or addressing circuitry. For example, each memory array of a stack may include a set of digit lines and deck selection circuitry, such as deck selection transistors or other switching circuitry, operable to couple the set of digit lines with a column decoder that may be shared among multiple decks. Each memory array of a stack also may include shunting circuitry, such as shunting transistors or other switching circuitry operable to couple the set of digit lines with a plate node, thereby equalizing a voltage across the memory cells of the respective memory array.

25 Claims, 7 Drawing Sheets

210

DECK-LEVEL SHUNTUNG IN A MEMORY DEVICE

FIELD OF TECHNOLOGY

The following relates to memory devices, including deck-level shunting in a memory device.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
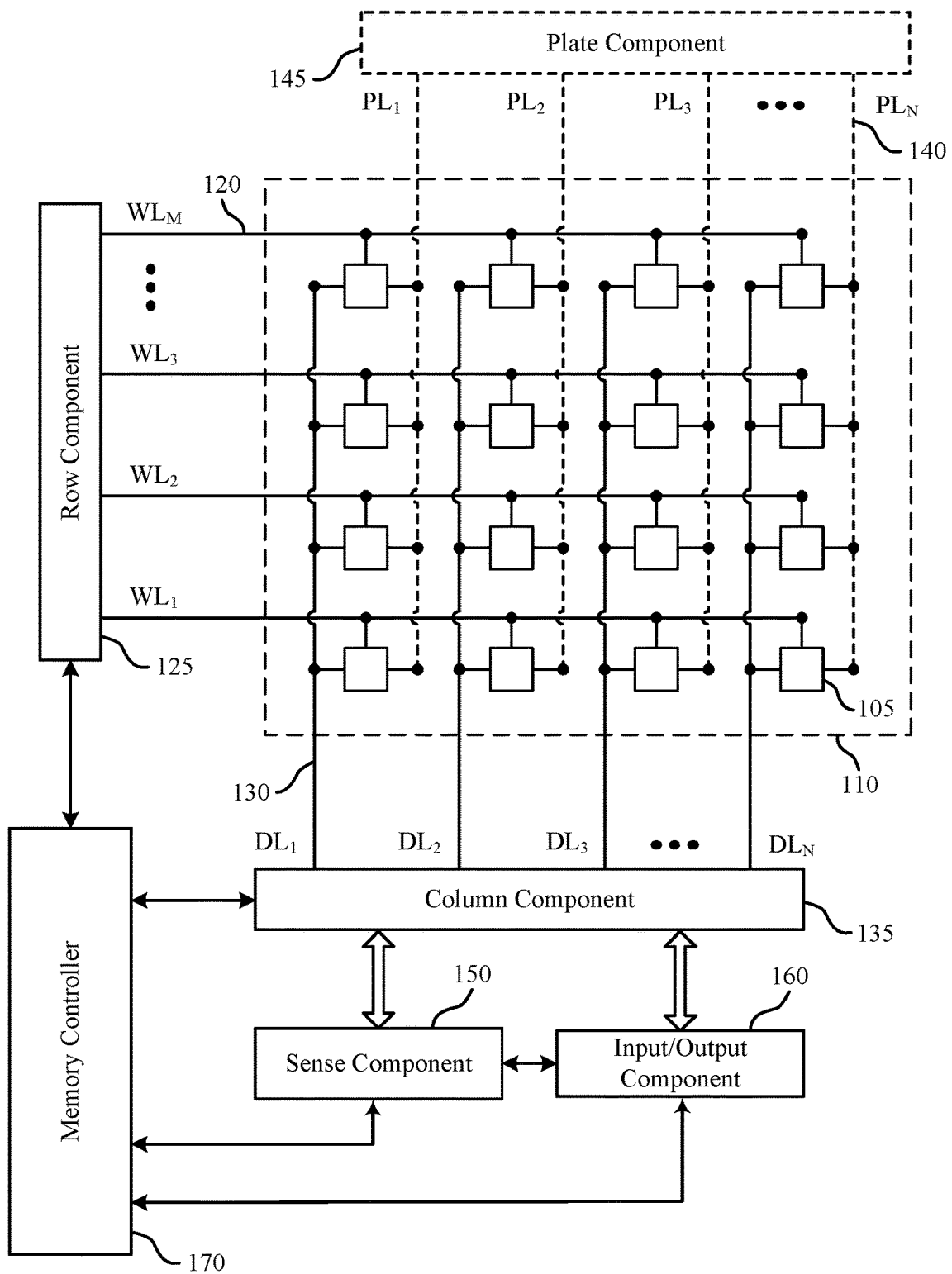
FIG. 1 illustrates an example of a memory device that supports deck-level shunting in a memory device in accordance with examples as disclosed herein.

Memory devices may include various arrangements of memory arrays formed over a substrate, where memory cells of the memory arrays may be organized or addressed in accordance with rows and columns. In some examples, circuitry that supports accessing or operating the memory arrays may be located below the memory arrays, which may refer to a location that is at least in part between the memory arrays and the substrate. For example, decoding or multiplexing circuitry, signal development circuitry, or sensing circuitry, among other types of circuitry, may be located below the memory arrays and, in some examples, may include transistors that are formed at least in part by doping portions of the substrate (e.g., creating substrate-based transistors, creating transistors having channels formed from doped crystalline silicon or other semiconductor). As memory devices scale with a greater quantity of layers or decks above a substrate, the area of a substrate used for such circuitry may increase, which may lead to various scaling limitations (e.g., related to the limited area of a substrate to support a growing quantity of decks and, by extension, a growing quantity and area for such supporting circuitry).

In accordance with examples as disclosed herein, a memory device may include memory arrays arranged in one or more stacks of decks (e.g., levels, layers) formed over a substrate, and a combination of deck selection circuitry (e.g., deck selection transistors, deck decoding or addressing switches) and shunting circuitry (e.g., shunting transistors, shunting or equalization switches) may be distributed among the decks to leverage common substrate-based circuitry, such as logic or addressing circuitry. For example, each memory array of a stack may include a set of digit lines of a corresponding deck, and deck selection circuitry, such as deck selection transistors or other switching circuitry (e.g., of the corresponding deck, of another deck) operable to couple the set of digit lines with a column decoder that may be shared among (e.g., coupled with) multiple decks. Each memory array of a stack also may include shunting circuitry, such as shunting transistors or other switching circuitry (e.g., of the corresponding deck, of another deck) operable to couple the set of digit lines with a plate node (e.g., an associated plate node, one or more associated plate lines), thereby equalizing a voltage across the memory cells of the respective memory array.

To access memory cells of a selected memory array (e.g., on one deck), the deck selection circuitry corresponding to the selected memory array may be activated (e.g., coupling digit lines of the selected memory array with the common column decoder). To isolate memory cells of a non-selected memory array (e.g., on another deck), the deck selection circuitry corresponding to the non-selected memory array may be deactivated (e.g., isolating digit lines of the non-selected memory array from the common column decoder). Further, to prevent or mitigate loss of stored information in the non-selected memory array, the shunting circuitry corresponding to a non-selected memory array may be activated (e.g., coupling or directly connecting digit lines of the non-selected memory array with an associated plate node), which may avoid voltage drift or other sources of depolarization of memory cells of the non-selected memory array. During access of a selected memory array, the shunting circuitry corresponding to the selected memory array may be deactivated (e.g., decoupling (e.g., opening) a direct connection between the digit lines of the selected memory array and associated plate node) to support read operations, write operations, or other access of the memory cells of the selected memory array.

Deck selection and shunting circuitry, such as deck selection transistors and shunting transistors, may leverage thin-film manufacturing techniques performed above a substrate, such as various techniques for forming transistors having vertical channels (e.g., channels oriented at least in part along a thickness or height direction of the memory die), or transistors having polycrystalline silicon channels, among other characteristics. Implementing deck selection and shunting circuitry at various decks of such a memory die may alleviate or mitigate area utilization challenges of a substrate level, such as moving some aspects of decoding or addressing into decks or levels above the substrate, or may support leveraging common logic signals or decoding circuitry, either or both of which may improve scaling in memory devices by supporting a greater quantity of decks for a given area of substrate-based circuitry.

Features of the disclosure are initially described in the context of a memory device and related circuitry as described with reference to FIGS. 1 through 3. Features of the disclosure are described in the context of a memory die layout, a timing diagram, and a logic signal generation circuit with reference to FIGS. 4 through 6. These and other features of the disclosure are further illustrated by and described with reference to an apparatus diagram and flowcharts that relate to deck-level shunting in a memory device as described with references to FIGS. 7 and 8.

FIG. 1 illustrates an example of a memory device 100 that supports deck-level shunting in a memory device in accordance with examples as disclosed herein. The memory device 100 may also be referred to as a memory die or an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, or capacitive storage element). In some examples, a charged and uncharged capacitor may represent two logic states, respectively. In some other examples, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In some examples, a memory cell 105 may include or otherwise be associated with a configurable material, which may be referred to as a material memory element, a material storage element, a material portion, and others. The configurable material may have one or more variable and configurable characteristics or properties (e.g., material states) that may represent different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold characteristics, or other properties that are detectable or distinguishable during a read operation to identify a logic state written to or stored by the configurable material.

In some cases, a configurable material of a memory cell 105 may be associated with a threshold voltage. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with one logic state or another. Accordingly, the magnitude of current, or other characteristic (e.g., thresholding behavior, resistance breakdown behavior, snapback behavior) associated with the current that results from applying a read voltage to the memory cell 105, may be used to determine a logic state written to or stored by memory cell 105.

In the example of memory device 100, each row of memory cells 105 may be coupled with one or more word lines 120 (e.g., $WL_1$ through $WL_M$), and each column of memory cells 105 may be coupled with one or more digit lines 130 (e.g., $DL_1$ through $DL_N$). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A target or selected memory cell 105 may be a memory cell 105 located at the intersection of an energized or otherwise selected word line 120 and an energized or otherwise selected digit line 130.

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node or terminal of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130, which may be referred to as activating the one or more memory cells 105 or coupling the one or more memory cells 105 with a respective one or more digit lines 130. A digit line 130 may then be accessed to read from or write to the respective memory cell 105.

In some examples, memory cells 105 may also be coupled with one or more plate lines 140 (e.g., $PL_1$ through $PL_N$). In some examples, each of the plate lines 140 may be independently addressable (e.g., supporting individual selection or biasing). In some examples, the plurality of plate lines 140 may represent or be otherwise functionally equivalent with a common plate, or other common node (e.g., a plate node common to each of the memory cells 105 in the memory array 110). When a memory cell 105 employs a capacitor for storing a logic state, a digit line 130 may provide access to a first terminal or a first plate of the capacitor, and a plate line 140 may provide access to a second terminal or a second plate of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer, a common plate node).

Access operations such as reading, writing, rewriting, and refreshing may be performed on a memory cell 105 by activating or selecting a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled using a row component 125 (e.g., a row decoder), a column component 135 (e.g., a column decoder), or a plate component 145 (e.g., a plate decoder), or a combination thereof. For example, a row component 125 may receive a row address from the memory controller 170 and activate a corresponding word line 120 based on the received row address. Similarly, a column component 135 may receive a column address from the memory controller 170 and activate a corresponding digit line 130. In some examples, such access operations may be accompanied by a plate component 145 biasing one or more of the plate lines 140 (e.g., biasing one of the plate lines 140, biasing some or all of the plate lines 140, biasing a common plate).

In some examples, the memory controller 170 may control operations (e.g., read operations, write operations, rewrite operations, refresh operations) of memory cells 105 using one or more components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set or subset of digit lines 130 connected to the sense component 150. For example, a sense component 150 may include a separate sensing circuit (e.g., a separate or duplicated sense amplifier, a separate or duplicated signal development component) for each of a set of digit lines 130 coupled with the sense component 150, such that a logic state may be separately detected for a respective memory cell 105 coupled with a respective one of the set of digit lines 130.

A memory cell 105 may be set, or written, by activating the relevant word line 120, digit line 130, or plate line 140 (e.g., via a memory controller 170). In other words, a logic state may be stored in a memory cell 105. A row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of a material memory architecture, a memory cell 105 may be written by applying a current, voltage, or other heating or biasing to a material memory element to configure the material according to a corresponding logic state.

In some examples, the memory device 100 may include multiple memory arrays 110 arranged in a stack of decks or levels relative to a substrate of the memory device 100 (e.g., a semiconductor substrate, a crystalline silicon substrate, a crystalline semiconductor substrate, a portion of a semiconductor wafer). Circuitry that supports accessing or operating the multiple memory arrays 110 may be located below the memory arrays 110, which may refer to a location that is at least in part between the memory arrays 110 and the substrate. For example, one or more row components 125, one or more column components 135, one or more plate components 145, one or more sense components 150, or one or more input/output components 160, or any combination thereof may be located below the memory arrays 110 and, in some examples, may include transistors that are formed at least in part by doping portions of the substrate (e.g., substrate-based transistors, transistors having channels formed from doped crystalline silicon or other semiconductor). When scaling the memory device 100 with a greater quantity of decks or levels of memory arrays 110, the area of a substrate used for the supporting circuitry may increase, which may lead to scaling limitations (e.g., related to the limited area of a substrate to support circuitry for accessing a growing quantity of decks or levels of memory arrays 110 and, by extension, a growing quantity and area for such decoders or other supporting circuitry), among other challenges.

In accordance with examples as disclosed herein, the memory device 100 may include memory arrays 110 arranged in one or more stacks of decks formed over a substrate, and a combination of deck selection circuitry (e.g., deck selection transistors, deck decoding or addressing switches) and shunting circuitry (e.g., shunting transistors, equalization components) may be distributed among the layers to leverage common substrate-based circuitry, such as logic or addressing circuitry. For example, each memory array 110 of a stack may include a set of digit lines 130 of a corresponding deck, and deck selection circuitry, such as deck selection transistors or other switching circuitry (e.g., of the corresponding deck, of another deck) operable to couple the set of digit lines 130 with a column decoder that may be shared among (e.g., coupled with) multiple decks. Each memory array 110 of a stack also may include shunting circuitry, such as shunting transistors or other switching circuitry (e.g., of the corresponding deck, of another deck) operable to couple the set of digit lines 130 with a plate node (e.g., an associated plate node, one or more associated plate lines 140), thereby equalizing a voltage across the memory cells 105 of the respective memory array 110.

In some examples, deck selection and shunting transistors may include thin-film transistors that leverage thin-film manufacturing techniques (e.g., above a substrate), such as various techniques for forming vertical transistors (e.g., transistors having vertical channels, transistors having channels oriented at least in part along a thickness or height direction relative to a substrate), or transistors having channel portions formed at least in part by polycrystalline silicon, among other techniques. Implementing deck selection and shunting circuitry at various decks of such a memory device 100 may alleviate or mitigate area utilization challenges of a substrate level, such as moving some aspects of decoding or addressing into decks or levels above the substrate, or may support leveraging common logic signals or decoding circuitry, either or both of which may improve scaling in memory devices by supporting a greater quantity of decks for a given area of substrate-based circuitry.

Figure 2:
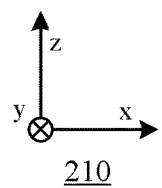
FIG. 2 illustrates an example of a transistor structure that supports deck-level shunting in a memory device in accordance with examples as disclosed herein.
Figure 2:
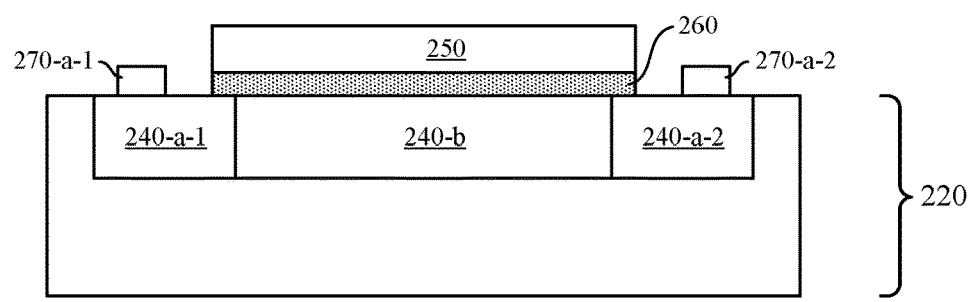
Figure 2:
Figure 3:
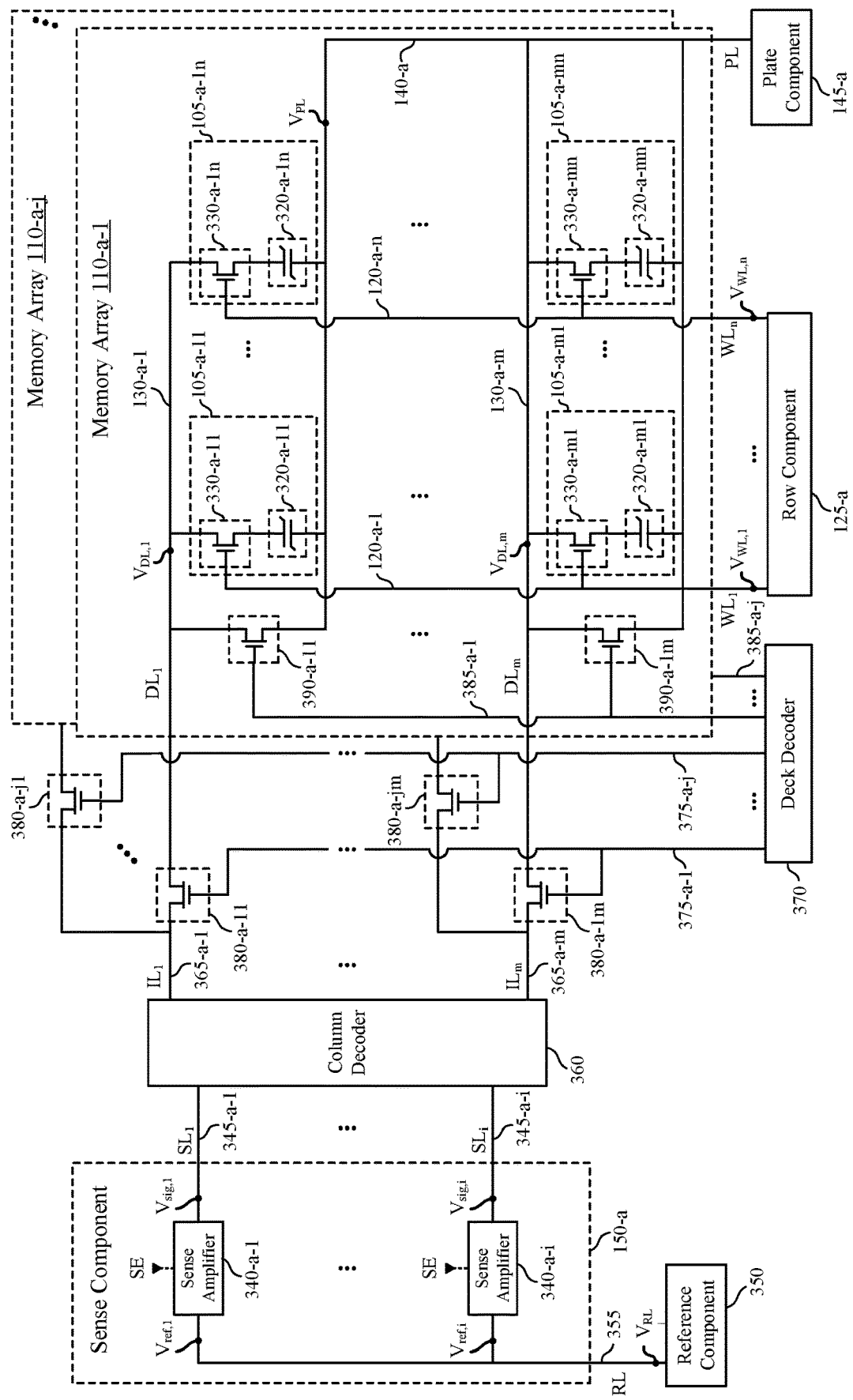
FIG. 3 illustrates an example of a circuit that supports deck-level shunting in a memory device in accordance with examples as disclosed herein.

FIG. 2 illustrates an example of a transistor structure 200 that supports deck-level shunting in a memory device in accordance with examples as disclosed herein. The transistor structure 200 illustrates an example of a transistor that is formed at least in part by portions of a substrate 220 (e.g., doped portions 240 of the substrate 220), and may illustrate an arrangement of features for a transistor that is configured in a planar transistor arrangement. The substrate 220 may be a portion of a semiconductor chip, such as a silicon chip of a memory die (e.g., crystalline silicon, monocrystalline silicon). For illustrative purposes, aspects of the transistor structure 200 may be described with reference to an x-direction, a y-direction, and a z-direction (e.g., a height direction) of a coordinate system 210. In some examples, the z-direction may be illustrative of a direction perpendicular to a surface of the substrate 220 (e.g., a surface in an xy-plane, a surface upon or over which other materials may be deposited), and each of the structures, illustrated by their respective cross section in an xz-plane, may extend for some distance (e.g., length) along the y-direction.

The transistor structure 200 illustrates an example of a transistor channel, electrically coupled between a terminal 270-*a*-1 and a terminal 270-*a*-2, that may include one or more doped portions 240 of the substrate 220. In various examples, one of the terminals 270-*a*-1 or 270-*a*-2 may be referred to as a source terminal, and the other of the terminals 270-*a*-1 or 270-*a*-2 may be referred to as a drain terminal, where such designation or nomenclature may be based on a configuration or relative biasing of a circuit that includes the transistor structure 200. The channel or channel portion of a transistor may include or refer to one or more portions of the transistor structure that are operable to open or close a conductive path (e.g., to modulate a conductivity, to form a channel, to open a channel, to close a channel) between a source and drain (e.g., between the terminal 270-*a*-1 and the terminal 270-*a*-2) based at least in part on a voltage of a gate (e.g., a gate terminal, a gate portion 250). In other words, a channel portion of a transistor structure may be configured to be activated, deactivated, made conductive, or made non-conductive, based at least in part on a voltage of a gate portion, such as gate portion 250. In some examples of transistor structure 200 (e.g., a planar transistor arrangement), the channel portion formed by one or more doped portions 240 of the substrate 220 may support a conductive path in a generally horizontal or in-plane direction (e.g., along the x-direction, within an xy-plane, in a direction within or parallel to a surface of the substrate 220).

In some examples, the gate portion 250 may be physically separated from the channel portion (e.g., separated from the substrate 220, separated from one or more of the doped portions 240) by a gate insulation portion 260 (e.g., a gate dielectric). Each of the terminals 270 may be in contact with or otherwise coupled with (e.g., electrically, physically) a respective doped portion 240-*a*, and each of the terminals 270 and the gate portion 250 may be formed from an electrically conductive material such as a metal or metal alloy, or a polycrystalline semiconductor (e.g., polysilicon).

In some examples, the transistor structure 200 may be operable as an n-type or n-channel transistor, where applying a relatively positive voltage to the gate portion 250 that is above a threshold voltage (e.g., an applied voltage having a positive magnitude, relative to a source terminal, that is greater than a threshold voltage) activates the channel portion or otherwise enables a conductive path between the terminals 270-*a*-1 and 270-*a*-2 (e.g., along a direction generally aligned with the x-direction within the substrate 220). In some such examples, the doped portions 240-*a* may refer to portions having n-type doping or n-type semiconductor, and the doped portion 240-*b* may refer to a portion having p-type doping or p-type semiconductor (e.g., a channel portion having an NPN configuration along the x-direction or channel direction).

In some examples, the transistor structure 200 may be operable as a p-type or p-channel transistor, where applying a relatively negative voltage to the gate portion 250 that is above a threshold voltage (e.g., an applied voltage having a negative magnitude, relative to a source terminal, that is greater than a threshold voltage) activates the channel portion or otherwise enables a conductive path between the terminals 270-a-1 and 270-a-2. In some such examples, the doped portions 240-a may refer to portions having p-type doping or p-type semiconductor, and doped portion 240-b may refer to a portion having n-type doping or n-type semiconductor (e.g., a channel portion having a PNP configuration along the x-direction or channel direction).

In some examples, circuitry operable to support access operations on memory cells 105 (e.g., a row component 125, a column component 135, a plate component 145, a sense component 150, a memory controller 170, or various combinations thereof) may be formed from respective sets of transistors each having the arrangement of the transistor structure 200, where each of the transistors may have a channel portion formed by respective doped portions 240 of a substrate 220. In some examples, such transistors may leverage a crystalline semiconductor material of the substrate 220 for various performance characteristics or manufacturing characteristics of such a material or an arrangement. Some examples of such an arrangement may be implemented in a complementary metal-oxide-semiconductor (CMOS) configuration, which may refer to various examples of a complementary and symmetrical pair of a p-type transistor and an n-type transistor (e.g., for logic functions). However, such structures or arrangements of substrate-based transistors may be limited by an available area of the substrate 220 (e.g., under a memory array 110 or stack of levels or decks of memory arrays 110).

In accordance with examples as disclosed herein, various aspects of a column component 135, among other circuitry, may be alternatively located away from (e.g., above) a substrate 220, including distributing various components or circuitry to levels or decks of a stack of memory arrays 110. For example, some circuitry, such as transistors that support aspects of decoding or addressing associated with the column component 135, or transistors that support aspects of voltage equalization between digit lines 130 and plate lines 140 of a non-selected memory array 110, may be formed in one or more layers or levels above a substrate 220, where such transistors may include or be referred to as thin film transistors, or vertical transistors, among other configurations or terminology FIG. 3 illustrates an example of a circuit 300 that supports deck-level shunting in a memory device in accordance with examples as disclosed herein. The circuit 300 may include a plurality of j memory arrays 110-a (e.g., memory arrays 110-a-1 through 110-a-j), each of which may be associated with a deck (e.g., a level, a vertical position, a height) above a substrate of a memory die (e.g., a substrate 220). For the sake of illustrative clarity, components of a memory array 110-a are described with reference to a first memory array 110-a-1, but each of the memory arrays 110-a-1 through 110-a-j of the circuit 300 may be associated with respective components or functionality, that is similar, different, or some combination thereof.

The first memory array 110-a-1 may include a set of memory cells 105-a (e.g., memory cells 105-a-11 through 105-a-mn, a set of memory cells 105 associated with the first memory array 110-a-1), which may be arranged according to m columns and n rows. In the example of circuit 300, each of the memory cells 105-a includes a respective capacitor 320-a and a respective cell selection component 330-a (e.g., a cell selection transistor). In some examples, one or more of the capacitors 320-a may be ferroelectric capacitors operable to store a charge or polarization corresponding to a logic state (e.g., for ferroelectric memory cells 105-a, according to a ferroelectric memory architecture). A ferroelectric material used in a ferroelectric capacitor 320 may be characterized by an electric polarization where the material maintains a non-zero electric charge in the absence of an electric field. Electric polarization within a ferroelectric capacitor 320 results in a net charge at the surface of the ferroelectric material, and attracts opposite charge through the terminals of the ferroelectric capacitor 320. Thus, charge may be stored at the interface of the ferroelectric material and the capacitor terminals. In some examples, memory cells 105-a may include storage elements of different memory architectures, such as linear capacitors (e.g., in a DRAM application), transistors (e.g., in a NAND application, in an SRAM application), or material memory elements (e.g., chalcogenide storage elements, resistive storage elements, thresholding storage elements), among other types of storage elements.

Each of the memory cells 105-a may be coupled with a word line 120 (e.g., one of word lines 120-a-1 through 120-a-n), a digit line 130 (e.g., one of digit lines 130-a-1 through 130-a-m), and a plate line 140-a. In some illustrative examples, memory cells 105-a-11 through 105-a-1n may represent a set or column of memory cells 105 coupled with or between a digit line 130 (e.g., digit line 130-a-1) and the plate line 140-a. In some illustrative examples, memory cells 105-a-11 through 105-a-m1 may represent a set or row of memory cells 105 coupled with a word line 120 (e.g., word line 120-a-1). Although the memory array 110-a-1 is illustrated as including a common plate line 140-a for all of the memory cells 105-a, some examples of a circuit 300 may include a separate plate lines 140 for each row of memory cells 105-a (e.g., an independently accessible plate line 140 associated with each of the word lines 120-a) or separate plate lines 140 for each column of memory cells 105-a (e.g., an independently accessible plate line 140 associated with each of the digit lines 130-a), among other configurations.

Each of the word lines 120-a (e.g., each of the word lines $WL_1$ through $WL_n$) may be associated with a respective word line voltage $V_{WL}$ as illustrated, and may be coupled with a row component 125-a (e.g., a row decoder). The row component 125-a may couple one or more of the word lines 120-a with various voltage sources (not shown). In some illustrative examples, the row component 125-a may selectively couple one or more of the word lines 120-a with a voltage source having a relatively high voltage (e.g., a selection voltage, which may be a voltage greater than 0V) or a voltage source having a relatively low voltage (e.g., a deselection voltage, which may be a ground voltage of 0V, or a negative voltage). Each of the digit lines 130-a (e.g., each of the digit lines $DL_1$ through $DL_m$) may be associated with a respective digit line voltage $V_{DL}$ as illustrated, and a memory cell 105-a, or capacitor 320-a or other storage element thereof, may be coupled with a digit line 130-a based at least in part on an activation or activation voltage of an associated word line 120-a.

In some examples, the row component 125-a may be shared among (e.g., coupled with, used for decoding, addressing, or accessing) the memory arrays 110-a-1 through 110-a-j. In various examples, an activation of a word line 120-a of the memory array 110-a-1 may or may not be accompanied by a corresponding activation of a word line 120 of one or more of the other memory arrays 110-a (e.g., activating a row in each of the memory arrays 110-a-1 through 110-a-j, activating a row in a subset of the memory arrays 110-a-1 through 110-a-j). For example, each output terminal or node of the row component 125-a may be coupled with a respective word line 120 of one or more of the memory arrays 110-a-1 through 110-a-j, or some subset thereof, which may include interconnections (e.g., vias, sockets, through-silicon vias (TSVs)) through the decks or levels of the memory device 100 or memory die that includes the circuit 300 to interconnect word lines 120 of the different decks or levels (e.g., of different ones of the memory arrays 110-a).

The plate line 140-a (e.g., plate line PL) may be associated with a plate line voltage $V_{PL}$ as illustrated, and may be coupled with a plate component 145-a (e.g., a plate decoder). The plate component 145-a may couple the plate line 140-a with various voltage sources (not shown). In one example, the plate component 145-a may selectively couple the plate line 140-a with a voltage source having a relatively high voltage (e.g., a plate high voltage, which may be a voltage greater than 0V) or a voltage source having a relatively low voltage (e.g., a plate low voltage, which may be a ground voltage of 0V, or a negative voltage).

In some examples, the plate component 145-a may be shared among (e.g., coupled with, used for decoding, addressing, or accessing) the memory arrays 110-a-1 through 110-a-j. In various examples, an activation of the plate line 140-a of the memory array 110-a-1 may or may not be accompanied by a corresponding activation of a plate line 140 of one or more of the other memory arrays 110-a (e.g., activating a common plate in each of the memory arrays 110-a-1 through 110-a-j, activating a common plate in a subset of the memory arrays 110-a-1 through 110-a-j). For example, each output terminal or node of the plate component 145-a may be coupled with a respective plate line 140 of one or more of the memory arrays 110-a-1 through 110-a-j, or some subset thereof, which may include interconnections (e.g., vias, sockets, TSVs) through the decks or levels of the memory device 100 or memory die that includes the circuit 300 to interconnect plate lines 140 of the different decks or levels. In some examples, one or more plate lines 140 of each of the memory arrays 110-a may be independently addressable, or may be otherwise biased independently from one another by the plate component 145-a.

The sense component 150-a may include various components for accessing (e.g., reading, writing) the memory cells 105 of the memory arrays 110-a-1 through 110-a-j. For example, the sense component 150-a may include a set of i sense amplifiers 340-a (e.g., sense amplifiers 340-a-1 through 340-a-i) each coupled between a respective signal line 345-a and a reference line 355. Each sense amplifier 340-a may include various transistors or amplifiers to detect, convert, or amplify a difference in signals, which may be referred to as latching. For example, a sense amplifier 340-a may include circuit elements that receive and compare a sense signal voltage (e.g., $V_{sig}$) of a respective signal line 345-a with a reference signal voltage (e.g., $V_{ref}$) of the reference line 355, which may be provided by a reference component 350. An output of a sense amplifier 340 may be driven to a higher (e.g., a positive) or a lower voltage (e.g., a negative voltage, a ground voltage) based on the comparison at the sense amplifier 340.

In some examples, electrical signals associated with such latching may be communicated between the sense component 150-a (e.g., sense amplifiers 340-a) and an input/output component 160, for example, via I/O lines (not shown). In some examples, the sense component 150-a may be in electronic communication with a memory controller (not shown), such as a memory controller 170 described with reference to FIG. 1, which may control various operations of the sense component 150-a. In some examples, activating a logical signal SE may be referred to as "enabling" or "activating" the sense component 150-a or sense amplifiers 340-a thereof. In some examples, activating logical signal SE may be referred to, or be part of an operation known as "latching" the result of accessing memory cells 105.

The circuit 300 may implement various techniques for multiplexing the digit lines 130 with the sense amplifiers 340-a to support accessing the memory cells 105-a. For example, a quantity of sense amplifiers 340-a of the sense component 150-a may be less than a quantity of digit lines 130 among the memory arrays 110-a-1 through 110-a-j, and certain ones of the digit lines 130 of the memory arrays 110-a-1 through 110-a-j may be coupled with certain ones of the sense amplifiers 340-a over a given duration for a performing an access operation. In accordance with examples as disclosed herein, the circuit 300 may support such multiplexing using a combination of a column decoder 360 and a deck decoder 370, which may refer to a distribution or separation of components or functionality of a column component 135 described with reference to FIG. 1.

The column decoder 360 may be configured to support multiplexing or coupling between the i sense amplifiers 340-a or i signal lines 345-a (e.g., signal lines 345-a-1 through 345-a-i, SU through $SL_i$) and m intermediate lines 365 (e.g., intermediate lines 365-a-1 through 365-a-m, $IL_1$ through $IL_m$). In some examples, m may be greater than i, such as m being an integer multiple of i. In some examples, m may be equal to a quantity of digit lines 130 or columns in each of the memory arrays 110-a-1 through 110-a-j.

The deck decoder 370 may be operable to select from among the memory arrays 110-a, which may include a selective coupling or isolation via respective transistors 380-a (e.g., deck selection transistors) between intermediate lines 365-a and digit lines 130-a of one or more selected memory arrays 110-a. In the example of circuit 300, each memory array 110-a may be associated with a respective row of transistors 380-a, which may be activated using a respective deck selection line 375-a. For example, memory array 110-a-1 may be associated with transistors 380-a-11 through 380-a-1m and a deck selection line 375-a-1, memory array 110-a-j may be associated with transistors 380-a-j1 through 380-a-jm and a deck selection line 375-a-j, and so on. In some examples, a quantity of memory arrays 110-a and deck selection lines 375-a (e.g., a quantity j) may be equal to a quantity of decks or levels of the circuit 300 (e.g., of a memory device 100 or a memory die that includes the circuit 300). In some examples (e.g., when multiple memory arrays 110-a are located on a same deck or level), a quantity of memory arrays 110-a and deck selection lines 375-a may be greater than a quantity of decks or levels (e.g., an integer multiple of decks or levels).

In some examples, when an access operation is to be performed on memory cells 105-a of the memory array 110-a-1, the deck decoder 370 may activate the deck selection line 375-a-1. Activating the deck selection line 375-a-1 may activate each of the transistors 380-a-11 through 380-a-1m, thereby coupling the digit lines 130-a-1 through 130-a-m with the column decoder 360 (e.g., via intermediate lines 365-a-1 through 365-a-m). The column decoder 360 may be accordingly operable for coupling one or more of the digit lines 130-a-1 through 130-a-m of the selected memory array 110-a-1 with the sense amplifiers 340-a-1 through 340-a-i to support various access operations (e.g., read operations, write operations).

In some examples, when an access operation is to be performed on memory cells 105-a of the memory array 110-*a*-1, the deck decoder 370 may deactivate other deck selection lines 375 (e.g., deck selection line 375-*a*-*j*, among others), which may deactivate each of the other transistors 380 (e.g., transistors 380-*a*-*j*1 through 380-*a*-*jm*, among others), thereby decoupling the digit lines 130 of the other memory arrays 110-*a* from the column decoder 360 (e.g., from intermediate lines 365-*a*-1 through 365-*a*-*m*). In some examples, such an isolation may improve read margins, power consumption, or other operation of the circuit 300, due to reduced intrinsic capacitance from the perspective of the sense amplifiers 340-*a*, or reduced charge leakage or dissipation (e.g., via unselected memory arrays 110-*a*), among other phenomena. Moreover, such isolation may support simplified row decoding (e.g., when word lines 120 of different memory arrays 110-*a* are coupled with a same or common output of the row component 125-*a*), since rows of multiple memory arrays 110-*a* may be activated while only the digit lines 130 of certain selected memory arrays 110-*a* may be coupled with circuitry supporting a given access operation.

In some examples, the deck decoder 370 or some other decoder circuitry also may be operable to support shunting of the memory arrays 110-*a*, which may include a coupling of or between digit lines 130-*a* of a memory array 110-*a* and one or more plate lines 140-*a* of the memory array 110-*a* (e.g., a direct connection, a shorting). Such shunting may equalize a voltage between the digit lines 130-*a* and the one or more plate lines 140-*a* of the memory array 110-*a*, which may equalize a voltage across the memory cells 105 of the memory array 110-*a*. A voltage equalization across memory cells 105 that are not targeted for an access operation may support preventing or mitigating voltage disturbances that may affect stored polarization at respective memory cells 105, among other purposes.

In some examples, shunting functionality may include a selective coupling or an isolation via respective transistors 390-*a* (e.g., shunting transistors) between digit lines 130-*a* and plate lines 140-*a* of one or more non-selected memory arrays 110-*a* (e.g., one or more memory arrays 110-*a* that are not selected for an access operation). In the example of circuit 300, each memory array 110-*a* may be associated with a respective row of transistors 390-*a*, which may be activated using a respective deck shunting line 385-*a*. For example, memory array 110-*a*-1 may be associated with transistors 390-*a*-11 through 390-*a*-*lm* and a deck shunting line 385-*a*-1, memory array 110-*a*-*j* may be associated with transistors 390-*a*-*j*1 through 390-*a*-*jm* (not shown) and a deck shunting line 385-*a*-*j*, and so on. In various examples, a quantity of deck shunting lines 385-*a* (e.g., a quantity j) may be equal to or greater than a quantity of decks or levels of the circuit 300.

In some examples, when an access operation is to be performed on memory cells 105 of the memory array 110-*a*-*j* (e.g., a selected or targeted memory array 110-*a*), the deck decoder 370 may activate the deck shunting line 385-*a*-1, among others (e.g., each of the deck shunting lines 385-*a*-1 through 385-*a*-(*j*-1), which may correspond to memory arrays 110-*a* that are also decoupled from the column decoder 360 via respective transistors 380-*a*). Activating the deck shunting line 385-*a*-1 may, in some examples, activate each of the transistors 390-*a*-11 through 390-*a*-1*m*, thereby coupling the digit lines 130-*a*-1 through 130-*a*-*m* with the plate line 140-*a*. Further, the deck decoder may deactivate the deck shunting line 385-*a*-*j*, which may deactivate each of the transistors 390-*a*-*j*1 through 390-*a*-*jm* of the memory array 110-*a*-*j*, thereby opening or disconnecting a direct connection between digit lines 130-*j*-1 through 130-*j*-*m* from a plate line 140-*j* (not shown) of the memory array 110-*a*-*j*. In some examples, when the circuit 300 is operating in an idle or standby condition, each of the deck shunting lines 385-*a*-1 through 385-*a*-*j* may be activated.

In some examples, the deck decoder 370 may operate deck selection lines and deck shunting lines using common logic signals, among other techniques for coordinated activation and deactivation. For example, an activation of the deck selection line 375-*a*-1 may be associated with a deactivation of the deck shunting line 385-*a*-1, or a deactivation of the deck selection line 375-*a*-1 may be associated with an activation of the deck shunting line 385-*a*-1, or both. In some examples, such techniques may be based on a common logic signal for a memory array 110-*a*, where an activation of such a common logic signal for the memory array 110-*a*-1 may be associated with both the activation of the deck selection line 375-*a*-1 and the deactivation of the deck shunting line 385-*a*-1, and vice versa. In some examples, a common logic signal may be applied to gates of each of the transistors 380 and 390 (e.g., when the transistors 380 are associated with a different channel type than the transistors 390). In some other examples, a common logic signal may be applied to the gates of either the transistors 380 or the transistors 390, and an inversion may be applied to the common logic signal before being applied to the gates of the other of the transistors 380 or 390 (e.g., when the transistors 380 and 390 are associated with the same channel type). In some examples, activation of either the transistors 380 or 390 may be delayed relative to deactivation of the other of the transistors 380 or 390, which may reduce or eliminate a duration over which both the transistors 380 and the transistors 390 are in a conductive state, which may reduce power consumption, charge leakage, or signal interference, among other benefits.

The configuration of components in the circuit 300 may support improved flexibility for layout or formation of a memory device 100 or memory die that includes the circuit 300. For example, the row component 125-*a*, the plate component 145-*a*, the sense component 150-*a*, the reference component 350, or the column decoder 360, or various combinations thereof, may be formed at least in part by circuitry that is below the memory arrays 110-*a*, or at least on another deck or level than the memory arrays 110-*a*. In some examples, such circuitry may be formed at least in part on a substrate (e.g., a substrate 220, a crystalline semiconductor portion), and may include various configurations of substrate-based transistors (e.g., in accordance with the transistor structure 200, including one or more sets of transistors in a CMOS configuration).

In accordance with examples as disclosed herein, the transistors 380 and 390 may be located above a substrate, including various locations among the decks or levels of the memory arrays 110-*a* (e.g., distributed among one or more decks or levels of a plurality of decks or levels above the substrate). For example, the transistors 380 and 390 may be formed using thin film fabrication techniques, such as including respective channel portions formed from polycrystalline semiconductor material (e.g., deposited over a substrate 220). In some examples, the transistors 380 and 390 may be formed as vertical transistors (e.g., transistors having a channel portion that is aligned in a height direction relative to a substrate 220), including various configurations that leverage one or more pillars of channel material having a conductivity that may be modulated based on a voltage of a respective gate portion. By locating the transistors 380 and 390 above a substrate, the circuit 300 may support improved flexibility for distributing decoding and shunting circuitry throughout a memory die, which may improve area utilization, or semiconductor material utilization, among other benefits.

Figure 4:
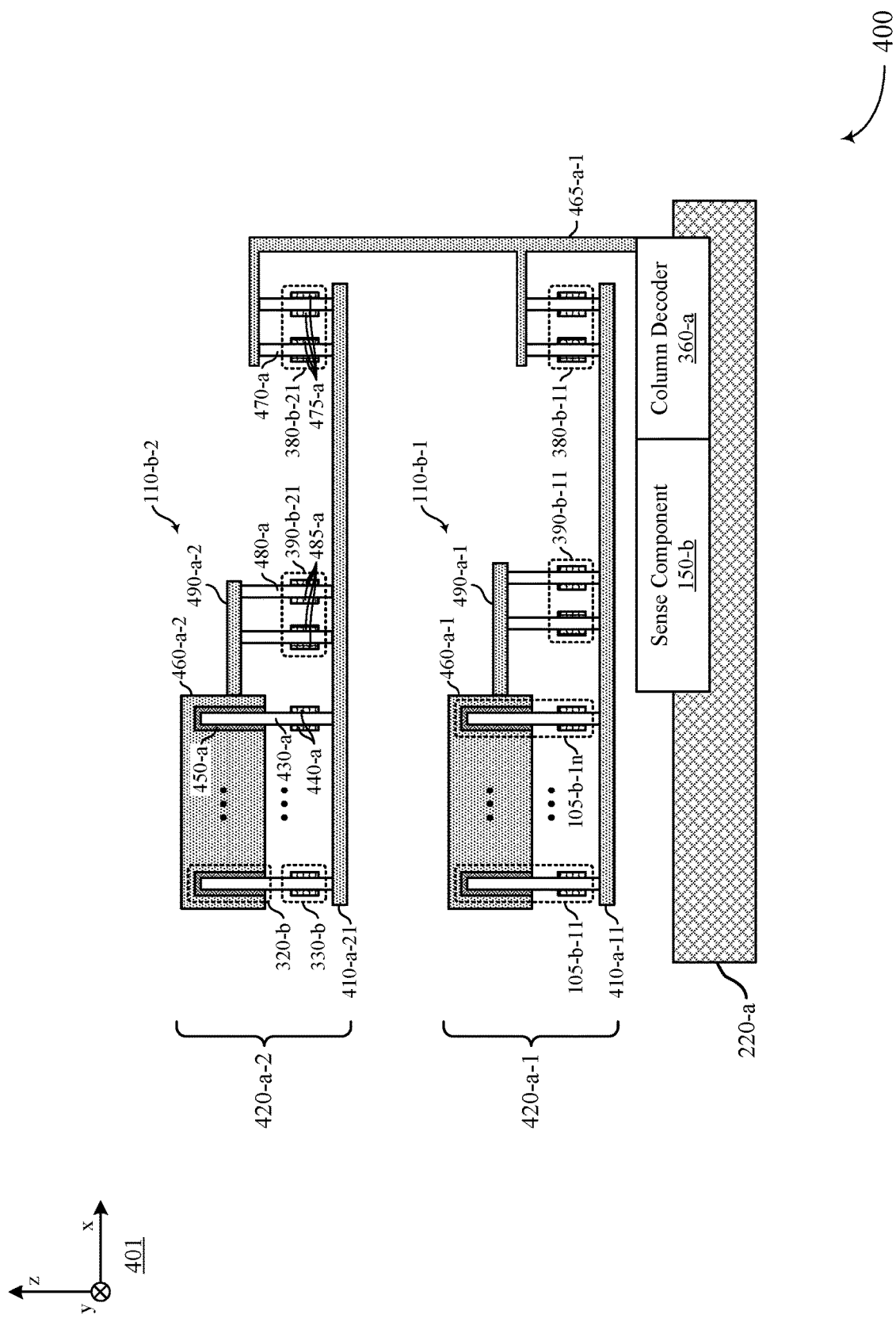
FIG. 4 illustrate an example of a memory structure that supports deck-level shunting in a memory device in accordance with examples as disclosed herein.

FIG. 4 illustrates an example of a memory structure 400 that supports deck-level shunting in a memory device in accordance with examples as disclosed herein. The memory structure 400 may be illustrative of portions of a memory device 100 or memory die that may be formed with or over a substrate 220-a, which may be an example of a substrate 220 described with reference to FIG. 2. The memory structure 400 may illustrate examples for implementing aspects of the circuit 300 described with reference to FIG. 3. For illustrative purposes, aspects of the memory structure 400 may be described with reference to an x-direction, a y-direction, and a z-direction of a coordinate system 401. The z-direction may be illustrative of a direction perpendicular to a surface of the substrate 220-a (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells), and the y-direction may be aligned with or referred to as a row direction (e.g., along a row of memory cells 105).

The memory structure 400 illustrates an example of memory arrays 110 associated with different levels 420 (e.g., different decks, a stack of decks, a stack of levels). For example, the memory array 110-b-1 may be associated with a level 420-a-1 at a first height or position relative to the substrate 220-a, and the memory array 110-b-2 may be associated with a level 420-a-2 at a second (e.g., different) height or position relative to the substrate 220-a (e.g., above the level 420-a-1, relative to the substrate 220-a). Although the memory structure 400 illustrates an example with two levels 420-a, techniques described herein may be applied in a memory structure having any quantity of one or more levels 420.

At least some, if not each of the memory arrays 110-b may include a respective set of memory cells 105-b arranged or addressed according to rows (e.g., aligned along the y-direction, addressed according to a position along the x-direction) and columns (e.g., aligned along the x-direction, addressed according to a position along the y-direction). For example, a column of the memory array 110-b-1 may include n memory cells 105-b-11 through 105-b-1n, and may be associated with (e.g., formed upon, formed in contact with, coupled with) a digit line conductor 410-a-11 (e.g., an example of a digit line 130). In some examples, a column of the memory array 110-b-2 may include a same quantity of memory cells 105-b, which may or may not be physically aligned (e.g., along the z-direction) or overlapping (e.g., when viewed in an xy-plane) with the memory cells 105-b of the memory array 110-b-1. A quantity of columns, m, may be formed by repeating the illustrated memory cells 105 and digit line conductors 410-a, among other features, along the y-direction.

At least some, if not each of the memory cells 105-b in the memory structure 400 may include a respective capacitor 320-b and a respective cell selection component 330-b (e.g., a transistor). In the example of memory structure 400, each of the cell selection components 330-b may be formed as a vertical transistor, which may include a channel portion (e.g., a vertical channel) formed at least in part by a respective pillar 430-a, or portion thereof (e.g., along the z-direction), and a gate portion formed at least in part by a respective word line conductor 440-a (e.g., an example of a word line 120). In some examples, the gate portion of a cell selection component 330-b may be a portion or a region of a word line 120 or word line conductor 440-a that is operable to activate the channel portion (e.g., to modulate a conductivity of the channel portion) of the cell selection component 330-b. The word line conductors 440-a may extend from one memory cell 105-b to another memory cell 105-b along a direction, such as the y-direction (e.g., a row direction, along a row of memory cells 105-b), and may be coupled with a row component 125 (not shown) for selecting or activating a row of memory cells 105-b (e.g., by biasing the word line conductors 440-a).

In some examples, word line conductors 440-a of one memory array 110-b (e.g., memory array 110-b-1) may be coupled or connected with word line conductors 440-a of another memory array 110-b (e.g., memory array 110-b-2), such that rows of memory cells 105-b may be commonly activated across multiple memory arrays 110-b or multiple levels 420-a (e.g., by a common node or output of a shared row component 125, not shown). In some examples, interconnections between word line conductors 440-a of different levels 420-a may be formed at least in part along the z-direction by one or more vias, sockets, or TSVs, which may be located at or near a boundary of the memory arrays 110-b (e.g., along the y-direction), among other locations relative to the memory arrays 110-b.

Each capacitor 320-b for a memory cell 105-b may include a respective dielectric portion 450-a formed between a pillar 430-a, or some portion otherwise aligned with a pillar (e.g., a portion aligned along the z-direction, an inner portion of the capacitor 320-b), associated with the memory cell 105-b and a plate conductor 460-a (e.g., an example of a plate line 140, a plate node, or a common plate, an outer portion of the capacitor 320-b). For example, each capacitor 320-b may include a respective inner portion aligned along the z-direction with or otherwise coincident with a pillar 430-a, and a respective outer portion (e.g., at least partially concentric around the inner portion) that is separated from the inner portion by a respective dielectric portion 450-a. In some examples, the outer portions of two or more capacitors 320-b may be a contiguous material, such as a contiguous metal or other conductor of a plate line or common plate node (e.g., of a plate conductor 460-a). In some examples, a portion of a pillar 430-a of a capacitor 320-b may be a same material or combination of materials as a portion of the pillar 430-a of a corresponding cell selection component 330-b (e.g., a doped semiconductor material, a polycrystalline semiconductor). In some examples, a portion of a pillar 430-a of capacitor 320-b may be or include a different material or combination of materials as a portion of the pillar 430-a of a corresponding cell selection component 330-b (e.g., a metal or conductor portion, a metal layer deposited on or over a surface of the pillar 430-a). In some examples, the dielectric portions 450-a may be formed with a ferroelectric material operable to maintain a non-zero electric charge or polarization (e.g., corresponding to a stored logic state) in the absence of an electric field.

In the example of memory structure 400, the memory array 110-b-1 may be associated with (e.g., coupled with, include, be accessed using) a plate conductor 460-a-1 and the memory array 110-b-2 may be associated with a plate conductor 460-a-2. Each of the plate conductors 460-a may be coupled with a plate component 145 (not shown) for biasing the plate conductors 460-a. In the example of memory structure 400, each plate conductor 460-a may be associated with at least a column of memory cells 105-*b*. In some examples, each of the plate conductors 460-*a* may also extend along the y-direction along a row of memory cells 105-*b*, in which case each of the plate conductors 460-*a* may be associated with all of the memory cells 105-*b* of a respective memory array 110-*b*. In some examples, a plate conductor 460-*a* may be a metal or other conductor formed over or between the dielectric portions 450-*a* of the memory cells 105-*b* of the respective memory array 110-*b*.

In the example of memory structure 400, each column of memory cells 105-*b* of each memory array 110-*b* may be associated with a respective transistor 380-*b* (e.g., a deck selection transistor), which may also be formed as a vertical transistor. Each transistor 380-*b* may be operable to couple a respective digit line conductor 410-*a* with an intermediate line conductor 465-*a* (e.g., an example of an intermediate line 365). In the example of memory structure 400, each intermediate line conductor 465-*a* may be a combination of horizontal metal layers formed in contact with (e.g., above, opposite the digit line conductors 410-*a*) pillars 470-*a* and a vertical portion coupled with the column decoder 360-*a* that may be formed by one or more vias, sockets, or TSVs. In the example of memory structure 400, to support m columns per memory array 110-*b*, m intermediate line conductors 465-*a* may be formed along the y-direction, and each intermediate line conductor 465-*a* may be coupled or connected with a transistor 380-*b* of each memory array 110-*b* or each level 420-*a* (e.g., intermediate line conductor 465-*a*-1 being coupled with transistors 380-*b*-11 and 380-*b*-21).

At least some, if not each transistor 380-*b* may include a channel portion (e.g., a vertical channel) formed at least in part by one or more respective pillars 470-*a* and a gate portion formed at least in part by one or more respective deck selection conductors 475-*a* (e.g., an example of a deck selection line 375). In some examples, the gate portion of a transistor 380-*b* may be a portion or a region of a deck selection line 375 that is operable to activate the channel portion (e.g., to modulate a conductivity of the channel portion) of the transistor 380-*b*. The deck selection conductors 475-*a* may extend from one column of memory cells 105-*b* to another, or from one transistor 380-*b* to another, along a direction, such as the y-direction (e.g., along a row direction, parallel with rows of memory cells 105), and may be coupled with a deck decoder 370 (not shown) for selecting or activating a memory array 110-*b* (e.g., by biasing the deck selection conductors 475-*a*, by activating a row of transistors 380-*b*).

The set of m intermediate line conductors 465-*a* may be coupled with a column decoder 360-*a*, which may, in turn, be coupled with a sense component 150-*b* (e.g., via a plurality of signal lines 345). Accordingly, a combination of a deck decoder 370 (not shown) and the column decoder 360-*a*, may be used to multiplex, address, or otherwise selectively couple the digit line conductors 410-*a* of the memory arrays 110-*b*-*a* and 110-*b*-2 with the sense component 150-*b*, or sense amplifiers 340 thereof, to support various access operations.

In the example of memory structure 400, each column of memory cells 105-*b* of each memory array 110-*b* may also be associated with a respective transistor 390-*b* (e.g., a shunting transistor), which also may be formed as a vertical transistor. Each transistor 390-*b* may be operable to couple a respective digit line conductor 410-*a* with a conductor portion 490-*a* (e.g., a conductor portion 490-*a* respective to the digit line conductor 410-*a*, a conductor portion 490-*a* common to the digit line conductors 410-*a* of a memory array 110-*b*, a plate connection), which may connect or shunt the respective digit line conductor 410-*a* with a plate conductor 460-*a*.

At least some, if not each transistor 390-*b* may include a channel portion (e.g., a vertical channel) formed at least in part by one or more respective pillars 480-*a* and a gate portion formed at least in part by one or more respective shunt selection conductors 485-*a* (e.g., an example of a deck shunting line 385). In some examples, the gate portion of a transistor 390-*b* may be a portion or a region of a deck shunting line 385 that is operable to activate the channel portion (e.g., to modulate a conductivity of the channel portion) of the transistor 390-*b*. The shunt selection conductors 485-*a* may extend from one column of memory cells 105-*b* to another, or from one transistor 390-*b* to another, along a direction, such as the y-direction (e.g., along a row direction, parallel with rows of memory cells 105), and may be coupled with a deck decoder 370 (not shown) for shunting a memory array 110-*b* (e.g., by biasing the shunt selection conductors 485-*a*, by activating a row of transistors 390-*b*).

The conductor portions 490-*a*, or the functionality thereof, may be provided by various types of structures. In the example of memory structure 400, each of the conductor portions 490-*a* may include a horizontal conductor portion (e.g., metal layer, a portion aligned along at least the x-direction) formed in contact with (e.g., above, opposite the digit line conductors 410-*a*) one or more pillars 480-*a*, and in contact with one or more plate conductors 460-*a*. In various examples, the conductor portions 490-*a* may be formed using one or more common processes or materials as the formation of intermediate line conductors 465-*a*, or the formation of plate conductors 460-*a*, or both. In some examples, a conductor portion 490-*a* may include multiple horizontal conductor portions, one or more vertical conductor portions (e.g., sockets, vias), or any combination thereof.

In some examples, the functionality of the conductor portions 490 may be provided by "shorted" or dummy cells or capacitors (not shown). For example, a conductor portion 490 may include a portion aligned and in contact with one or more pillars 480, or a material portion or extension of a pillar 480, which may have a similar material, similar dimension, or other aspects similar to an inner portion of a capacitor 320. Additionally or alternatively, a conductor portion 490 may include a portion having a similar material, similar dimension, or other aspects similar to an outer portion of a capacitor 320. In such cases, the conductor portions 490-*a* may be formed with one or processes that are also used for forming capacitors 320, but may omit a dielectric portion 450.

In various examples, each of the pillars 430, 470, and 480 may be operable to support at least a portion of a channel of a respective transistor (e.g., a channel or operable conductive path aligned along the z-direction, supporting an electrical coupling or conductive path between source and drain terminals based at least in part on a voltage of a respective gate portion, gate terminal, or gate conductor), and may include one or more doped semiconductor portions. For example, to support an n-type transistor, a pillar 430, a pillar 470, or a pillar 480 may include at least a p-type semiconductor portion, or may include a stack (e.g., in the z-direction) of an n-type semiconductor, a p-type semiconductor, and an n-type semiconductor (e.g., in an NPN arrangement along the z-direction), among other constituent materials or arrangements. To support a p-type transistor, a pillar 430, a pillar 470, or a pillar 480 may include at least an n-type semiconductor portion, or may include a stack (e.g., along the z-direction) of a p-type semiconductor, an n-type semiconductor, and a p-type semiconductor (e.g., in an PNP arrangement in the z-direction), among other constituent materials or arrangements. In some examples, a pillar as described herein (e.g., a pillar 430, a pillar 470, a pillar 480) may include one or more electrodes or electrode portions, such as an electrode at one or both ends of the pillar (e.g., a top end, a bottom end, or both).

Each of the pillars 430, 470, and 480 may be associated with a height or a height dimension relative to the substrate (e.g., a lower extent in the z-direction, an upper extent in the z-direction, a span in the z-direction), which may be defined as part of balancing various performance criteria of the memory arrays 110. In some examples, a height dimension or extent in the z-direction of the pillars 430 and the pillars 470, or the pillars 430 and the pillars 480, or the pillars 470 and the pillars 480, or the pillars 430, 470, and 480, may be the same as or at least partially overlapping with a height dimension or extent in the z-direction. For example, various combinations of the pillars 430, 470, and 480 may have a common height dimension (e.g., a common upper extent, a common lower extent, or both) relative to the substrate. In some examples, the pillars 430 may have a height or a height dimension that is different than the pillars 470, or the pillars 480, or both, such as the pillars 430 having an extended height along the z-direction to support one or more features of the capacitors 320. The pillars 430, 470, and 480 may be formed with various cross-sectional shapes (e.g., in an xy-plane), such as a square shape, a rectangular shape, a circular shape, an oval shape, or a polygonal shape, among others, where pillars 430, 470, and 480 may have common or different shapes, or common or different dimensions.

The pillars 430, 470, and 480 may be formed according to various techniques. In some examples, one or more layers or stacks of layers of doped semiconductor material may be deposited on or above a substrate (e.g., on or in contact with a digit line conductor 410, or corresponding metal layer), and portions of the deposited layers located between respective pillars 430, 470, and 480 (e.g., along the x-direction, along the y-direction) may be etched away or trenched to form the respective pillars. In some examples, pillars 430, 470, and 480 may be formed from the same material or combination of materials (e.g., from a same layer or stack of layers, to support a common type of transistor channel). In some examples, such layers may include one or more electrode layers, such as an electrode layer above a stack of doped semiconductor material layers, an electrode layer below a stack of doped semiconductor material layers, or both, and such electrode layers may be or may not be etched or trenched along with the pillar formation processes. Additionally or alternatively, in some examples, holes or trenches may be etched through a material (e.g., in the z-direction, through a dielectric material, through a gate dielectric material) and material for the pillars 430, 470, or 480 (e.g., one or more doped semiconductor materials, one or more electrode materials) may be deposited in the etched holes or trenches. In examples where pillar material is deposited into holes, trenches, or other recesses, pillars 430, 470, and 480 may or may not be formed from a same material or combination of materials.

In various examples, a quantity or configuration of pillars 430, 470, and 480 for a respective transistor may be defined or chosen for particular characteristics, such as an associated drive strength (e.g., drive current), impedance, activation threshold, or leakage characteristic of a particular transistor or set of transistors. In some examples, multiple pillars 430, multiple pillars 470, or multiple pillars 480 may be described as or configured as parallel physical structures (e.g., parallel channels) of a common transistor or transistor component. For example, as illustrated, each of the transistors 380-*b* may include or be otherwise formed with two pillars 470-*a*, and each of the transistors 390-*b* may include or be otherwise formed with two pillars 480-*a*. However, in other examples, a transistor 380, a transistor 390, or a cell selection component 330 may include or be otherwise formed with any quantity of one or more pillars 470, 480, or 430, respectively. Likewise, in various examples, a capacitor 320 may be formed with or over any quantity of one or more pillars 430. In some examples, each pillar 430, 470, or 480 of a set that is configured in parallel (e.g., commonly activated) may be described as or configured as a component of single transistor, such that a corresponding cell selection, deck selection, or deck shunting may be described as or configured as having multiple transistors in a parallel arrangement.

In some examples, various combinations of word line conductors 440, deck selection conductors 475, and shunt selection conductors 485 of a given memory array 110 may be formed using one or more common operations, one or more common materials, or otherwise share various aspects of formation or configuration. For example, word line conductors 440, deck selection conductors 475, and shunt selection conductors 485 may be formed using one or more common conductor formation processes (e.g., a common masking process, a common etching process, a common deposition process, or various combinations thereof). In some examples, word line conductors 440, deck selection conductors 475, and shunt selection conductors 485 may be formed with a height dimension that is within or overlapping with a height dimension of at least doped semiconductor portions of the pillars 430, 470, and 480 (e.g., respectively, supporting the function of modulating a conductivity through channel portions of the cell selection components 330, transistors 380, and transistors 390 respectively).

In various examples, word line conductors 440, deck selection conductors 475, or shunt selection conductors 485 may be formed from a metal or metal alloy (e.g., copper, tungsten, gold, silver, tin, aluminum, or alloys thereof). Such conductors may be separated from pillars 430, 470, or 480 (along the x-direction, along the y-direction, along the x-direction and the y-direction, along a radial direction) by a gate dielectric that is in contact with portions of the conductor and the respective pillar. In some examples, gate conductors may be located alongside the respective pillars (e.g., as a transverse gate, as a pass-by gate, as a pair of gate conductors on either or both sides of a pillar), including conductors extending between the pillars along the y-direction and separated from pillars along the x-direction by a gate dielectric. In some examples, gate conductors may include at least a portion that wraps (e.g., partially, entirely) around respective pillars (e.g., as a wrap-around gate, as a circumferential gate, as a concentric gate, as an all-around gate), where at least the respective pillars may be wrapped (e.g., partially wrapped, entirely wrapped) with a circumferential gate dielectric that is in contact with the pillar and the conductor. In various examples, the digit line conductors 410 or intermediate line conductors 465, among other components such as conductors, may be formed from a metal or metal alloy, which may be a same material or a different material as conductors used to support transistor gate portions (e.g., word line conductors 440, deck selection conductors 475, shunt selection conductors 485).

In some examples, circuitry of a deck decoder 370 (not shown), the column decoder 360-*a*, or the sense component 150-*b*, or any combination thereof may be substrate-based, such as including transistors formed at least in part by a doped portion of the substrate 220-*b* (e.g., in accordance with the transistor structure 200, transistors configured in a CMOS arrangement). By including the transistors 380-*b* and 390-*b* in locations above the substrate 220-*a*, the memory structure 400 may support improved flexibility for distributing decoding and shunting circuitry throughout a memory die, which may improve area utilization, or semiconductor substrate material utilization, among other benefits.

Although the implementation of transistors 380-*b* and transistors 390-*b* associated with a given memory array 110-*b* show the pillars 470-*a* and 480-*a* as being within the same level 420-*a*, other implementations may be provided in accordance with the techniques disclosed herein. For example, transistors 380 or transistors 390 may be located or positioned in a different level 420 than an associated memory array 110, such as when deck selection or decoding for multiple levels 420 is implemented in a common level (e.g., a level 420, a substrate level), and shunting is implemented in the respective levels 420 of each memory array 110 (e.g., where transistors 380-*a* for both the memory array 110-*b*-1 and the memory array 110-*b*-2 are located in the level 420-*a*-1, transistors 390-*a* for the memory array 110-*b*-1 are located in the level 420-*a*-1, and transistors 390-*a* for the memory array 110-*b*-2 are located in the level 420-*a*-2, not shown). Moreover, the techniques described herein may be implemented to support memory devices or memory dies having multiple memory arrays 110 on a given level 420, which may include various common or independent addressing or accessing techniques, among other techniques.

Figure 5:
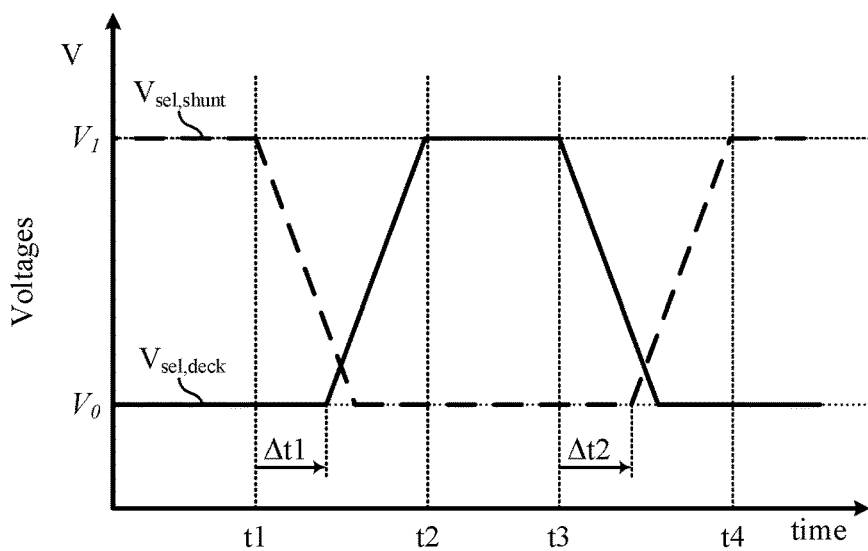
FIG. 5 illustrates an example of a signal diagram that supports deck-level shunting in a memory device in accordance with examples as disclosed herein.

FIG. 5 illustrates an example of a signal diagram 500 that supports deck-level shunting in a memory device in accordance with examples as disclosed herein. The signal diagram 500 illustrates voltage signals that may be applied over time to transistors 380 and 390 associated with a memory array 110. For example, $V_{sel,shunt}$ may be illustrative of a voltage that may be applied to transistors 390 of a memory array 110 (e.g., for activating or deactivating shunting transistors), and $V_{sel,deck}$ may be illustrative of a voltage that may be applied to transistors 380 of the same memory array 110 (e.g., for activating or deactivating deck selection transistors). The respective signals are illustrated relative to a first voltage, $V_0$, which may correspond to a deactivation or deselection voltage (e.g., a ground voltage, a negative voltage, a voltage associated with an open or isolating channel portion) and a second voltage, $V_1$, which may correspond to an activation or selection voltage (e.g., a positive voltage, a voltage associated with a closed or coupling channel portion). In some examples, such voltages may be associated with operation of n-type transistors, and the illustrated polarities of either $V_{sel,deck}$ or $V_{sel,shunt}$ may be inverted if the corresponding transistors are configured as p-type transistors.

As illustrated in signal diagram 500, an initial state (e.g., a standby state, an idle state, a deselected state) may correspond to the memory array 110 being deselected, such that transistors 380 are deactivated (e.g., isolating the memory array 110 from a column decoder 360) and transistors 390 are activated (e.g., shunting the digit lines 130 with one or more plate lines 140 of the memory array 110).

At t1, the memory array 110 may be selected (e.g., for an access operation, in response to an access command), which may initiate a transition of $V_{sel,shunt}$ to the deactivation voltage and may open a direct connection between the digit lines 130 and the one or more plate lines 140 of the memory array 110. The initiation of t1 may also be associated with initiating a transition of $V_{sel,deck}$ to the activation voltage, which may couple the digit lines 130 with a column decoder 360. In some examples, the transition of $V_{sel,deck}$ at t1 may be delayed relative to the transition of $V_{sel,shunt}$ (e.g., by a delay duration Δt1) to prevent or reduce a duration in which transistors 380 and 390 are both in a conductive state, which may provide various benefits such as reducing power consumption or reducing signal degradation (e.g., loss or reduction in read signals), among others. In some examples, a delay duration may be configured as a tradeoff with access latency, and accordingly may be configurable based on a type of access operation being performed, a power condition or mode, a performance mode, or other considerations. In some examples, the delay duration Δt1 may be omitted. In some examples, the operations of t1 may be associated with signaling for other memory arrays 110, such as transitioning or maintaining $V_{sel,deck}$ for the other memory arrays 110 to the deactivation voltage, or transitioning or maintaining $V_{sel,shunt}$ for the other memory arrays 110 to the activation voltage, or both.

At t2, the digit lines 130 of the memory array 110 may be fully coupled or connected with the column decoder or other circuitry for supporting access operations on the memory array 110. For example, between t2 and t3, one or more access operations may be performed, such as one or more read operations, write operations, refresh operations, or other operations.

At t3, the memory array 110 may be deselected, which may initiate a transition of $V_{sel,deck}$ to the deactivation voltage, thereby isolating the digit lines 130 from the column decoder 360. The initiation of t3 may also be associated with initiating a transition of $V_{sel,shunt}$ to the activation voltage, which may close a direct connection between the digit lines 130 and the one or more plate lines 140. In some examples, the transition of $V_{sel,shunt}$ at t3 may be delayed relative to the transition of $V_{sel,deck}$ (e.g., by a delay duration Δt2, which may be the same as or different than the delay duration Δt2) to prevent or reduce a duration in which transistors 380 and 390 are both in a conductive state, which may provide similar benefits as the delay duration Δt1, and may be supported by similar configurability. In some examples, the delay duration Δt2 may be omitted.

At t4, the digit lines 130 of the memory array 110 may be fully isolated or disconnected from the column decoder 360 (e.g., via transistors 380), and the memory array 110 may return to the initial state where the digit lines 130 are shunted or connected with the one or more plate lines 140 (e.g., via transistors 390).

Figure 6:
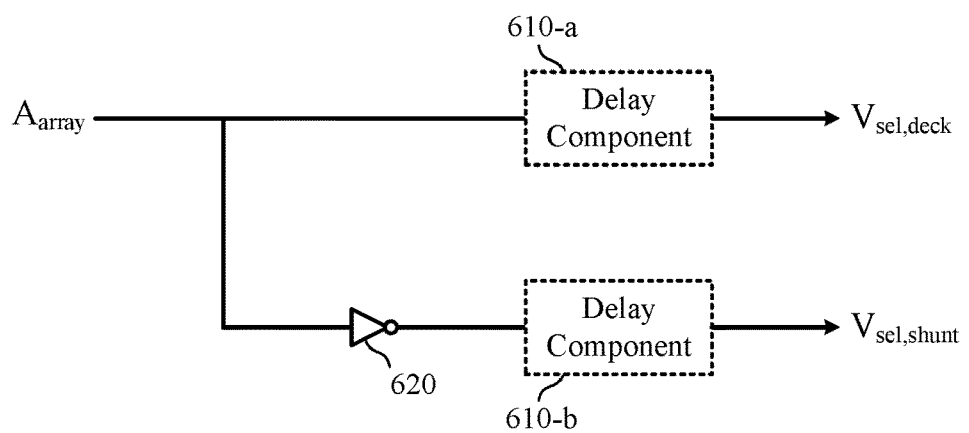
FIG. 6 illustrates an example of a signal generation circuit that supports deck-level shunting in a memory device in accordance with examples as disclosed herein.

FIG. 6 illustrates an example of a signal generation circuit 600 that supports deck-level shunting in a memory device in accordance with examples as disclosed herein. In some examples, the signal generation circuit 600 may correspond to signaling for one memory array 110, and the signal generation circuit 600 may be repeated for each of a plurality of memory arrays 110 of a memory device 100. In various examples, the one or more signal generation circuits 600 may be included in a deck decoder 370. In some examples, the signal generation circuit 600 may be configured to generate activation or selection signals in accordance with the signal diagram 500.

The signal generation circuit 600 may receive a logic signal, $A_{array}$, from a signal source (e.g., an activation signal source, a logic signal source, a memory controller 170), which may correspond to an activation signal for a given memory array 110. In some examples, the logic signal $A_{array}$ may be forwarded (e.g., directly coupled with) deck selection conductors 475 to activate or deactivate transistors 380 using the signal $V_{sel,deck}$ (e.g., when $A_{array}$ is configured to transition between the voltage levels V0 and V1 described with reference to the signal diagram 500). In some examples, such signaling may be processed through a delay component 610-*a*, which may be configured to impose a rising edge delay between $A_{array}$ and $V_{sel,deck}$, corresponding to Δt1. In some examples, the logic signal $A_{array}$ may be inverted (e.g., by an inverter 620) before being forwarded (e.g., coupled with) shunt selection conductors 485 to activate or deactivate transistors 390 using the signal $V_{sel,shunt}$. In some examples, such signaling may be processed through a delay component 610-*b*, which may be configured to impose a rising edge delay between $A_{array}$ and $V_{sel,shunt}$, corresponding to Δt2.

Although the signal generation circuit 600 is illustrated with the inverter 620 being between $A_{array}$ and $V_{sel,shunt}$, in some other implementations in accordance with the described techniques, an inverter 620 may be positioned between $A_{array}$ and $V_{sel,deck}$. Moreover, in some examples, delay components 610-*a* or 610-*b* may be configured with rising edge delays, falling edge delays, or both, or one or both of the delay components 610-*a* or 610-*b* may be omitted. Although the signal generation circuit 600 illustrates a technique for controlling transistors 380 and 390 of a given memory array 110 with a single logic signal, in some other examples, transistors 380 and 390 may be independently controllable (e.g., based on two of more logic or control signals).

Figure 7:
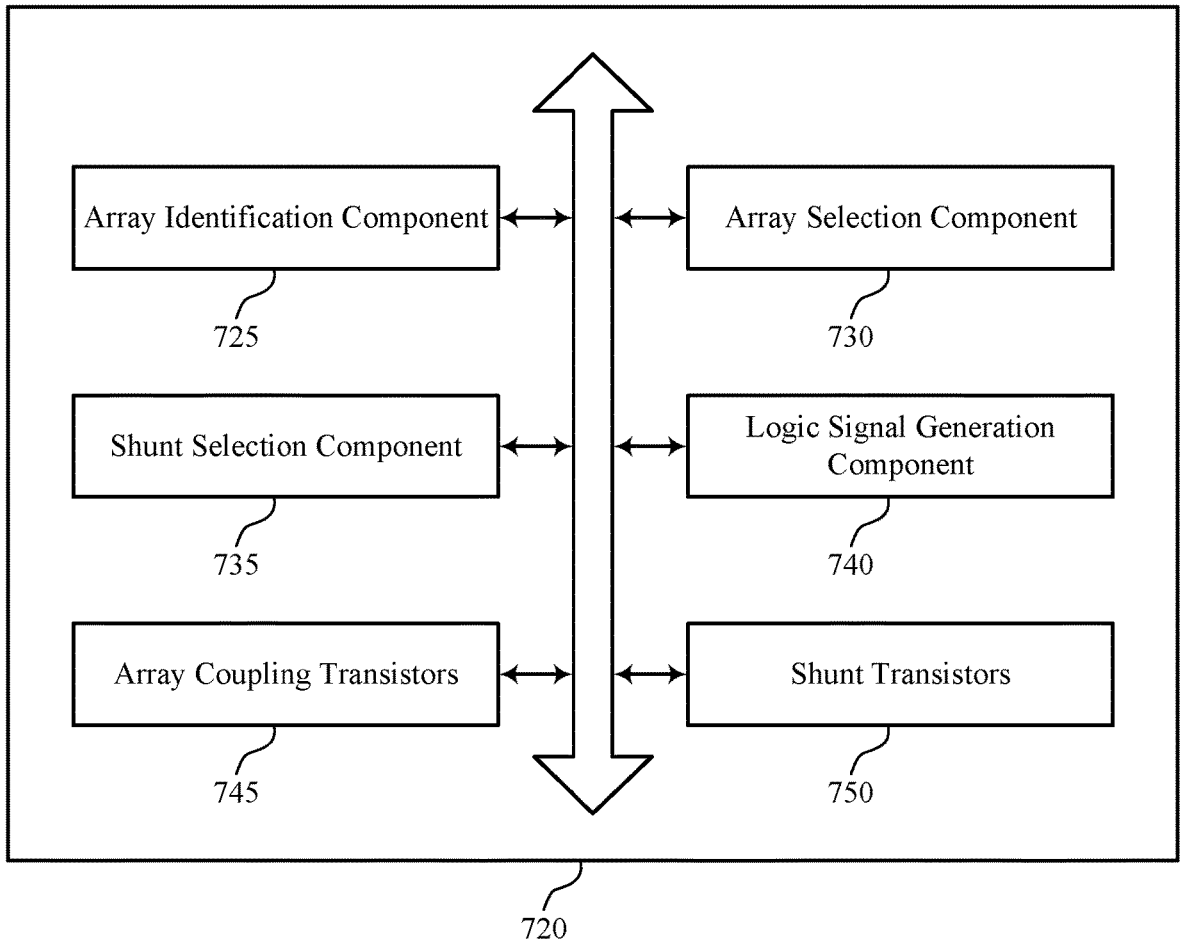
FIG. 7 shows a block diagram of a memory device that supports deck-level shunting in a memory device in accordance with examples as disclosed herein.

FIG. 7 shows a block diagram 700 of a memory device 720 that supports deck-level shunting in a memory device in accordance with examples as disclosed herein. The memory device 720 may be an example of aspects of a memory device as described with reference to FIGS. 1 through 6. The memory device 720, or various components thereof, may be an example of means for performing various aspects of deck-level shunting in a memory device as described herein. For example, the memory device 720 may include an array identification component 725, an array selection component 730, a shunt selection component 735, a logic signal generation component 740, an array coupling transistors 745, a shunt transistors 750, or any combination thereof. Each of these components may communicate, directly or indirectly, with one another (e.g., via one or more buses).

The array identification component 725 may be configured as or otherwise support a means for identifying a first memory array of a memory die for an access operation, the memory die including the first memory array in a first level above a substrate of the memory die and a second memory array of the memory die in a second level above the substrate. The array selection component 730 may be configured as or otherwise support a means for coupling, based at least in part on activating a plurality of first transistors of the first level, a plurality of first digit lines of the first memory array with a column decoder of the memory die based at least in part on the identifying. In some examples, the array selection component 730 may be configured as or otherwise support a means for isolating, based at least in part on deactivating a plurality of second transistors of the second level, a plurality of second digit lines of the second memory array from the column decoder based at least in part on the identifying. The shunt selection component 735 may be configured as or otherwise support a means for coupling, based at least in part on activating a plurality of third transistors of the second level, the plurality of second digit lines with a plate conductor of the second level based at least in part on the identifying.

In some examples, the logic signal generation component 740 may be configured as or otherwise support a means for generating a logic signal based at least in part on the identifying, and isolating the plurality of second digit lines of the second level from the column decoder and coupling the plurality of second digit lines with the plate conductor of the second level may be based at least in part on the generated logic signal.

In some examples, each of the plurality of second transistors may be configured with a first channel type, and each of the plurality of third transistors may be configured with a second channel type. In some examples, isolating the plurality of second digit lines of the second level from the column decoder and coupling the plurality of second digit lines with the plate conductor of the second level may be based at least in part on applying the generated logic signal to respective gate portions of each of the plurality of second transistors and each of the plurality of third transistors.

In some examples, the array coupling transistors 745 may be configured as or otherwise support a means for isolating the plurality of second digit lines from the column decoder based at least in part on applying the logic signal to gate portions of each of the plurality of second transistors. In some examples, the shunt transistors 750 may be configured as or otherwise support a means for coupling the plurality of second digit lines with the plate conductor based at least in part on applying an inversion of the generated logic signal to gate portions of each of the plurality of third transistors.

In some examples, coupling the plurality of second digit lines with the plate conductor of the second level may be performed after isolating the plurality of second digit lines from the column decoder (e.g., based on logical delay supported by a delay component).

In some examples, the shunt selection component 735 may be configured as or otherwise support a means for deactivating, based at least in part on the identifying, a plurality of fourth transistors of the first level that are coupled between a place of the first level and the plurality of first digit lines.

Figure 8:
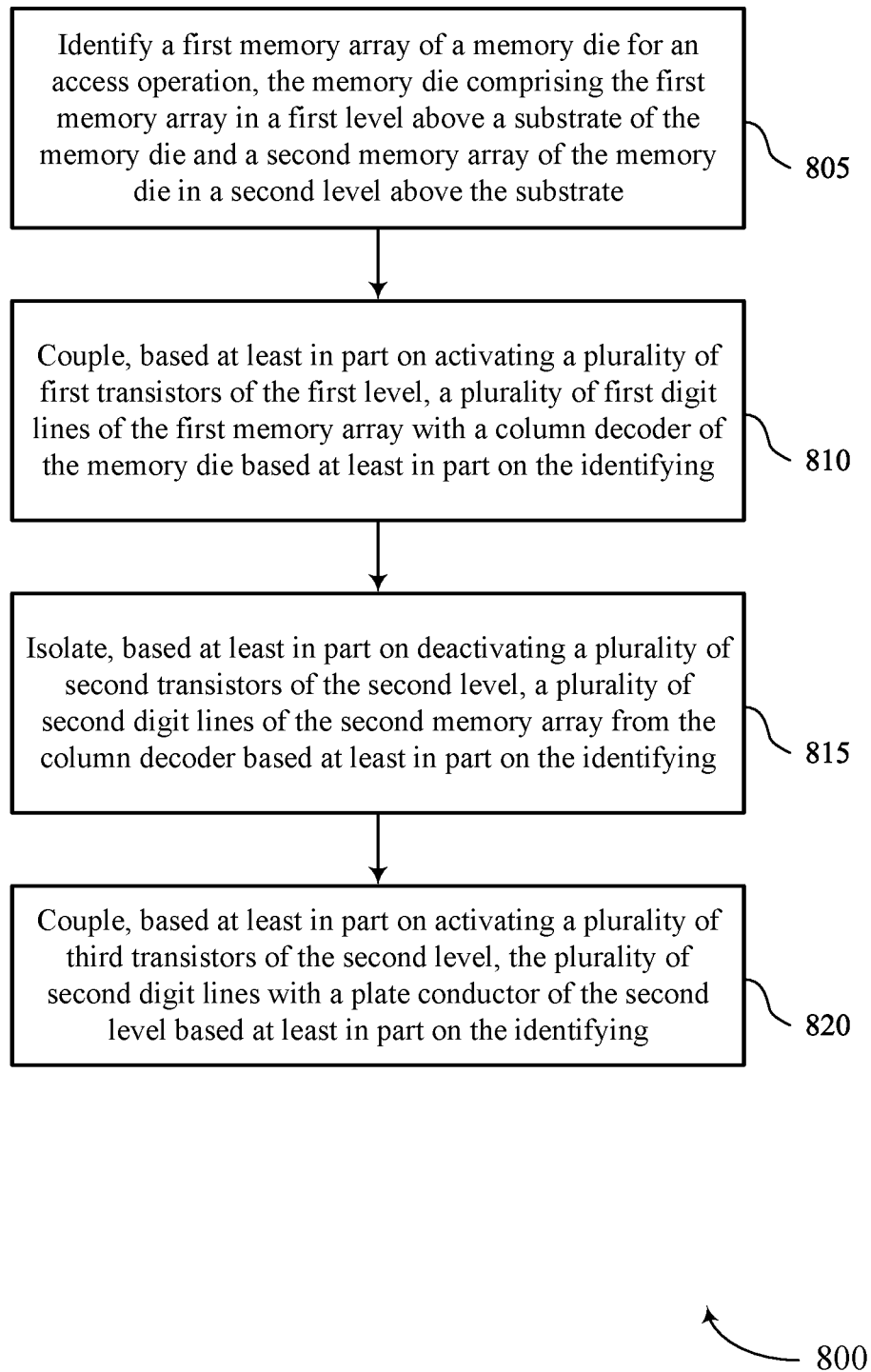
FIG. 8 shows a flowchart illustrating a method or methods that support deck-level shunting in a memory device in accordance with examples as disclosed herein.

FIG. 8 shows a flowchart illustrating a method 800 that supports deck-level shunting in a memory device in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include identifying a first memory array of a memory die for an access operation, the memory die including the first memory array in a first level above a substrate of the memory die and a second memory array of the memory die in a second level above the substrate. The operations of 805 may be performed in accordance with examples as disclosed herein. In some examples, aspects of the operations of 805 may be performed by an array identification component 725 as described with reference to FIG. 7.

At 810, the method may include coupling, based at least in part on activating a plurality of first transistors (e.g., of the first level, of a different level), a plurality of first digit lines of the first memory array with a column decoder of the memory die based at least in part on the identifying. The operations of 810 may be performed in accordance with examples as disclosed herein. In some examples, aspects of the operations of 810 may be performed by an array selection component 730 as described with reference to FIG. 7.

At 815, the method may include isolating, based at least in part on deactivating a plurality of second transistors (e.g., of the second level, of a different level), a plurality of second digit lines of the second memory array from the column decoder based at least in part on the identifying. The operations of 815 may be performed in accordance with examples as disclosed herein. In some examples, aspects of the operations of 815 may be performed by an array selection component 730 as described with reference to FIG. 7.

At 820, the method may include coupling, based at least in part on activating a plurality of third transistors of the second level, the plurality of second digit lines with a plate conductor of the second level based at least in part on the identifying. The operations of 820 may be performed in accordance with examples as disclosed herein. In some examples, aspects of the operations of 820 may be performed by a shunt selection component 735 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor) for identifying a first memory array of a memory die for an access operation, the memory die including the first memory array in a first level above a substrate of the memory die and a second memory array of the memory die in a second level above the substrate, coupling, based at least in part on activating a plurality of first transistors (e.g., of the first level, of a different level), a plurality of first digit lines of the first memory array with a column decoder of the memory die based at least in part on the identifying, isolating, based at least in part on deactivating a plurality of second transistors (e.g., of the second level, of a different level), a plurality of second digit lines of the second memory array from the column decoder based at least in part on the identifying, and coupling, based at least in part on activating a plurality of third transistors of the second level, the plurality of second digit lines with a plate conductor of the second level based at least in part on the identifying.

Some examples of the method 800 and the apparatus described herein may further include operations, features, circuitry, logic, means, or instructions for generating a logic signal based at least in part on the identifying, and isolating the plurality of second digit lines of the second level from the column decoder and coupling the plurality of second digit lines with the plate conductor of the second level may be based at least in part on the generated logic signal.

In some examples of the method 800 and the apparatus described herein, each of the plurality of second transistors may be configured with a first channel type, and each of the plurality of third transistors may be configured with a second channel type. In some examples, isolating the plurality of second digit lines of the second level from the column decoder and coupling the plurality of second digit lines with the plate conductor of the second level may be based at least in part on applying the generated logic signal to respective gate portions of each of the plurality of second transistors and each of the plurality of third transistors.

In some examples of the method 800 and the apparatus described herein, isolating the plurality of second digit lines from the column decoder may be based at least in part on applying the logic signal to gate portions of each of the plurality of second transistors and coupling the plurality of second digit lines with the plate conductor may be based at least in part on applying an inversion of the generated logic signal to gate portions of each of the plurality of third transistors.

In some examples of the method 800 and the apparatus described herein coupling the plurality of second digit lines with the plate conductor of the second level may be performed after isolating the plurality of second digit lines from the column decoder.

Some examples of the method 800 and the apparatus described herein may further include operations, features, circuitry, logic, means, or instructions for deactivating, based at least in part on the identifying, a plurality of fourth transistors of the first level that are coupled between a place of the first level and the plurality of first digit lines.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a column decoder of a memory die, a first memory array associated with a first level above a substrate of the memory die, and a second memory array associated with a second level above the substrate of the memory die. In some examples of the apparatus, the first memory array may include a plurality of first digit lines each operable to couple with the column decoder via a respective first transistor (e.g., of the first level, of a different level), and a plurality of second transistors of the first level each operable to couple a respective one of the plurality of first digit lines with a first plate of the first level. In some examples of the apparatus, the second memory array may include a plurality of second digit lines each operable to couple with the column decoder via a respective third transistor (e.g., of the second level, of a different level), and a plurality of fourth transistors of the second level each operable to couple a respective one of the plurality of second digit lines with a second plate of the second level.

In some examples of the apparatus, each of the first transistors and each of the second transistors may include a respective channel portion of the first level, and each of the third transistors and each of the fourth transistors may include a respective channel portion of the second level.

In some examples of the apparatus, the channel portion of each of the first transistors, each of the second transistors, each of the third transistors, and each of the fourth transistors may be operable to form a respective channel (e.g., a vertical channel) that is aligned along a direction (e.g., a height direction) relative to the substrate.

Some examples of the apparatus may include one or more first conductors (e.g., gate conductors) of the first level each operable to modulate a conductivity of the channel portion of each of the first transistors, one or more second conductors (e.g., gate conductors) of the first level each operable to modulate a conductivity of the channel portion of each of the second transistors, one or more third conductors (e.g., gate conductors) of the second level each operable to modulate a conductivity of the channel portion of each of the third transistors, and one or more fourth conductors (e.g., gate conductors) of the second level each operable to modulate a conductivity of the channel portion of each of the fourth transistors.

Some examples of the apparatus may include a first activation signal source operable to activate either the one or more first conductors or the one or more second conductors with a first activation signal, and a first inverter coupled between the first activation signal source and the other of the one or more first conductors or the one or more second conductors and operable to deactivate the other of the one or more first conductors or the one or more second conductors with an inversion of the first activation signal. Some examples of the apparatus may include a second activation signal source operable to activate either the one or more third conductors or the one or more fourth conductors with a second activation signal, and a second inverter coupled between the second activation signal source and the other of the one or more third conductors or the one or more fourth conductors and operable to deactivate the other of the one or more third conductors or the one or more fourth conductors with an inversion of the second activation signal.

Some examples of the apparatus may include a first rising edge delay component between the first activation signal source and the either the one or more first conductors or the one or more second conductors, and a second rising edge delay component between the first inverter and the other of the one or more first conductors or the one or more second conductors. Some examples of the apparatus may include a third rising edge delay component between the second activation signal source and the either the one or more third conductors or the one or more fourth conductors, and a fourth rising edge delay component between the second inverter and the other of the one or more third conductors or the one or more fourth conductors.

In some examples of the apparatus, the channel portion of each of the first transistors includes a respective set of one or more first semiconductor pillars over the substrate of the memory die in the first level and in contact with the respective first digit line of the plurality of first digit lines, and the channel portion of each of the second transistors includes a respective set of one or more second semiconductor pillars over the substrate of the memory die in the first level and in contact with the respective first digit line of the plurality of first digit lines. In some examples of the apparatus, the channel portion of each of the third transistors includes a respective set of one or more third semiconductor pillars over the substrate of the memory die in the second level and in contact with the respective second digit line of the plurality of second digit lines, and the channel portion of each of the fourth transistors includes a respective set of one or more fourth semiconductor pillars over the substrate of the memory die in the second level and in contact with the respective fourth digit line of the plurality of second digit lines.

In some examples of the apparatus, the first semiconductor pillars may be overlapping, along a height dimension relative to the substrate, with the second semiconductor pillars and the third semiconductor pillars may be overlapping, along the height dimension relative to the substrate, with the fourth semiconductor pillars.

In some examples of the apparatus, each memory cell of a first plurality of memory cells of the first memory array may be associated with a respective fifth transistor (e.g., a cell selection transistor) of the first level operable to couple the memory cell with a first digit line of the plurality of first digit lines, each of the fifth transistors including a respective channel portion including a respective set of one or more fifth semiconductor pillars overlapping, along a height dimension relative to the substrate, with the first semiconductor pillars. In some examples of the apparatus, each memory cell of a second plurality of memory cells of the second memory array may be associated with a respective sixth transistor (e.g., a cell selection transistor) of the second level operable to couple the memory cell with a digit line of the plurality of second digit lines, each of the sixth transistors including a respective channel portion including a respective set of one or more sixth semiconductor pillars overlapping, along the height dimension relative to the substrate, with the third semiconductor pillars.

In some examples of the apparatus, each memory cell of the first plurality of memory cells may include a first inner portion aligned along the height dimension with the respective fifth pillar, a first outer portion concentric around the first inner portion, and a first ferroelectric portion between the first inner portion and the first outer portion. In some examples of the apparatus, each memory cell of the second plurality of memory cells may include a second inner portion aligned along the height dimension with the respective sixth pillar, a second outer portion concentric around the second inner portion, and a second ferroelectric portion between the second inner portion and the second outer portion.

In some examples (e.g., where a shunt connections are provided via dummy cells), the apparatus may include a plurality of first plate connections, each first plate connection connecting the first plate with the channel portion of a respective one of the second transistors, where each first plate connection includes a first conductor portion, aligned along the height dimension with a respective second pillar, the first conductor portion having a same material as the first inner portions and overlapping in the height dimension with the first inner portions and a plurality of second plate connections, each second plate connection connecting the second plate with the channel portion of a respective one of the fourth transistors, where each second plate connection includes a second conductor portion, aligned along the height dimension with a respective fourth pillar, the second conductor portion having a same material as the second inner portions and overlapping in the height dimension with the second inner portions.

In some examples, the apparatus may include at least one first conductor portion connecting the first plate with the respective channel portion of each of the second transistors and at least one second conductor portion connecting the second plate with the respective channel portion of each of the fourth transistors.

In some examples of the apparatus, each of the first transistors and each of the third transistors may be configured with a first channel type (e.g., an n-type channel, a p-type channel) and each of the second transistors and each of the fourth transistors may be configured with a second channel type different than the first channel type.

Another apparatus is described. The apparatus may include a first memory array in a first level above a substrate, the first memory array associated with a plurality of first digit lines of the first level and a first plate conductor of the first level, a second memory array in a second level above the substrate, the second memory array associated with a plurality of second digit lines of the second level and a second plate conductor of the second plate level, and a column decoder. Some examples of the apparatus may include circuitry operable to identify the first memory array for an access operation, couple, based at least in part on activating a plurality of first transistors (e.g., of the first level, of a different level), the plurality of first digit lines with the column decoder based at least in part on the identifying, isolate, based at least in part on deactivating a plurality of second transistors (e.g., of the second level, of a different level), the plurality of second digit lines from the column decoder based at least in part on the identifying, and couple, based at least in part on activating a plurality of third transistors of the second level, the plurality of second digit lines with the second plate conductor based at least in part on the identifying.

In some examples of the apparatus, the circuitry may be operable to isolate the plurality of second digit lines of the second level from the column decoder and couple the plurality of second digit lines with the plate conductor of the second level based at least in part on a common logic signal.

In some examples of the apparatus, the circuitry may include an inverter operable to invert the common logic signal for either the isolation of the plurality of second digit lines from the column decoder or the coupling of the plurality of second digit lines with the plate conductor.

In some examples of the apparatus, each of the plurality of second transistors may be configured with a first channel type, and each of the plurality of third transistors may be configured with a second channel type.

In some examples of the apparatus, each of the plurality of second transistors and each of the plurality of third transistors may be configured with a same channel type.

In some examples of the apparatus, the circuitry may be operable to delay the coupling of the plurality of second digit lines with the plate conductor relative to the isolation of the plurality of second digit lines from the column decoder.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a column decoder of a memory die;
a first memory array associated with a first level above a substrate of the memory die, the first memory array comprising:
a plurality of first digit lines each operable to couple with the column decoder via a respective first transistor of the first level; and
a plurality of second transistors of the first level each operable to couple a respective one of the plurality of first digit lines with a first plate of the first level; and
a second memory array associated with a second level above the substrate of the memory die, the second memory array comprising:
a plurality of second digit lines each operable to couple with the column decoder via a respective third transistor of the second level; and
a plurality of fourth transistors of the second level each operable to couple a respective one of the plurality of second digit lines with a second plate of the second level.

2. The apparatus of claim 1, wherein:
each of the first transistors and each of the second transistors comprises a respective channel portion of the first level; and
each of the third transistors and each of the fourth transistors comprises a respective channel portion of the second level.

3. The apparatus of claim 2, wherein:
the channel portion of each of the first transistors, each of the second transistors, each of the third transistors, and each of the fourth transistors is operable to form a respective channel that is aligned along a direction relative to the substrate.

4. The apparatus of claim 2, further comprising:
one or more first conductors of the first level each operable to modulate a conductivity of the channel portion of each of the first transistors;
one or more second conductors of the first level each operable to modulate a conductivity of the channel portion of each of the second transistors;
one or more third conductors of the second level each operable to modulate a conductivity of the channel portion of each of the third transistors; and
one or more fourth conductors of the second level each operable to modulate a conductivity of the channel portion of each of the fourth transistors.

5. The apparatus of claim 4, further comprising:
a first activation signal source operable to activate either the one or more first conductors or the one or more second conductors with a first activation signal;
a first inverter coupled between the first activation signal source and the other of the one or more first conductors or the one or more second conductors and operable to deactivate the other of the one or more first conductors or the one or more second conductors with an inversion of the first activation signal;
a second activation signal source operable to activate either the one or more third conductors or the one or more fourth conductors with a second activation signal; and
a second inverter coupled between the second activation signal source and the other of the one or more third conductors or the one or more fourth conductors and operable to deactivate the other of the one or more third conductors or the one or more fourth conductors with an inversion of the second activation signal.

6. The apparatus of claim 5, further comprising:
a first rising edge delay component between the first activation signal source and the either the one or more first conductors or the one or more second conductors;
a second rising edge delay component between the first inverter and the other of the one or more first conductors or the one or more second conductors;
a third rising edge delay component between the second activation signal source and the either the one or more third conductors or the one or more fourth conductors; and
a fourth rising edge delay component between the second inverter and the other of the one or more third conductors or the one or more fourth conductors.

7. The apparatus of claim 2, wherein:
the channel portion of each of the first transistors comprises a respective set of one or more first semiconductor pillars over the substrate of the memory die in the first level and in contact with the respective first digit line of the plurality of first digit lines;
the channel portion of each of the second transistors comprises a respective set of one or more second semiconductor pillars over the substrate of the memory die in the first level and in contact with the respective first digit line of the plurality of first digit lines;
the channel portion of each of the third transistors comprises a respective set of one or more third semiconductor pillars over the substrate of the memory die in the second level and in contact with the respective second digit line of the plurality of second digit lines; and
the channel portion of each of the fourth transistors comprises a respective set of one or more fourth semiconductor pillars over the substrate of the memory die in the second level and in contact with the respective fourth digit line of the plurality of second digit lines.

8. The apparatus of claim 7, wherein:
the first semiconductor pillars are overlapping, along a height dimension relative to the substrate, with the second semiconductor pillars; and
the third semiconductor pillars are overlapping, along the height dimension relative to the substrate, with the fourth semiconductor pillars.

9. The apparatus of claim 7, wherein:
each memory cell of a first plurality of memory cells of the first memory array is associated with a respective fifth transistor of the first level operable to couple the memory cell with a first digit line of the plurality of first digit lines, each of the fifth transistors comprising a respective channel portion comprising a respective set of one or more fifth semiconductor pillars overlapping, along a height dimension relative to the substrate, with the first semiconductor pillars; and
each memory cell of a second plurality of memory cells of the second memory array is associated with a respective sixth transistor of the second level operable to couple the memory cell with a digit line of the plurality of second digit lines, each of the sixth transistors comprising a respective channel portion comprising a respective set of one or more sixth semiconductor pillars overlapping, along the height dimension relative to the substrate, with the third semiconductor pillars.

10. The apparatus of claim 9, wherein:
each memory cell of the first plurality of memory cells comprises a first inner portion aligned along the height dimension with the respective fifth pillar, a first outer portion concentric around the first inner portion, and a first ferroelectric portion between the first inner portion and the first outer portion; and
each memory cell of the second plurality of memory cells comprises a second inner portion aligned along the height dimension with the respective sixth pillar, a second outer portion concentric around the second inner portion, and a second ferroelectric portion between the second inner portion and the second outer portion.

11. The apparatus of claim 10, further comprising:
a plurality of first plate connections, each first plate connection connecting the first plate with the channel portion of a respective one of the second transistors, wherein each first plate connection comprises a first conductor portion, aligned along the height dimension with a respective second pillar, the first conductor portion having a same material as the first inner portions and overlapping in the height dimension with the first inner portions; and
a plurality of second plate connections, each second plate connection connecting the second plate with the channel portion of a respective one of the fourth transistors, wherein each second plate connection comprises a second conductor portion, aligned along the height dimension with a respective fourth pillar, the second conductor portion having a same material as the second inner portions and overlapping in the height dimension with the second inner portions.

12. The apparatus of claim 2, further comprising:
at least one first conductor portion connecting the first plate with the respective channel portion of each of the second transistors; and
at least one second conductor portion connecting the second plate with the respective channel portion of each of the fourth transistors.

13. The apparatus of claim 1, wherein:
each of the first transistors and each of the third transistors are configured with a first channel type; and
each of the second transistors and each of the fourth transistors are configured with a second channel type different than the first channel type.

14. A method, comprising:
identifying a first memory array of a memory die for an access operation, the memory die comprising the first memory array in a first level above a substrate of the memory die and a second memory array of the memory die in a second level above the substrate;
coupling, based at least in part on activating a plurality of first transistors of the first level, a plurality of first digit lines of the first memory array with a column decoder of the memory die based at least in part on the identifying;
isolating, based at least in part on deactivating a plurality of second transistors of the second level, a plurality of second digit lines of the second memory array from the column decoder based at least in part on the identifying; and
coupling, based at least in part on activating a plurality of third transistors of the second level, the plurality of second digit lines with a plate conductor of the second level based at least in part on the identifying.

15. The method of claim 14, further comprising:
generating a logic signal based at least in part on the identifying, wherein isolating the plurality of second digit lines of the second level from the column decoder and coupling the plurality of second digit lines with the plate conductor of the second level are based at least in part on the generated logic signal.

16. The method of claim 15, wherein:
each of the plurality of second transistors are configured with a first channel type, each of the plurality of third transistors are configured with a second channel type, and
isolating the plurality of second digit lines of the second level from the column decoder and coupling the plurality of second digit lines with the plate conductor of the second level is based at least in part on applying the generated logic signal to respective gate portions of each of the plurality of second transistors and each of the plurality of third transistors.

17. The method of claim 15, wherein:
isolating the plurality of second digit lines from the column decoder is based at least in part on applying the logic signal to gate portions of each of the plurality of second transistors; and
coupling the plurality of second digit lines with the plate conductor is based at least in part on applying an inversion of the generated logic signal to gate portions of each of the plurality of third transistors.

18. The method of claim 14, wherein coupling the plurality of second digit lines with the plate conductor of the second level is performed after isolating the plurality of second digit lines from the column decoder.

19. The method of claim 14, further comprising:
deactivating, based at least in part on the identifying, a plurality of fourth transistors of the first level that are coupled between a place of the first level and the plurality of first digit lines.

20. An apparatus, comprising:
a first memory array in a first level above a substrate, the first memory array associated with a plurality of first digit lines of the first level and a first plate conductor of the first level;
a second memory array in a second level above the substrate, the second memory array associated with a plurality of second digit lines of the second level and a second plate conductor of the second plate level;
a column decoder; and
circuitry operable to:
identify the first memory array for an access operation;
couple, based at least in part on activating a plurality of first transistors of the first level, the plurality of first digit lines with the column decoder based at least in part on the identifying;
isolate, based at least in part on deactivating a plurality of second transistors of the second level, the plurality of second digit lines from the column decoder based at least in part on the identifying; and
couple, based at least in part on activating a plurality of third transistors of the second level, the plurality of second digit lines with the second plate conductor based at least in part on the identifying.

21. The apparatus of claim 20, wherein the circuitry is operable to isolate the plurality of second digit lines of the second level from the column decoder and couple the plurality of second digit lines with the plate conductor of the second level based at least in part on a common logic signal.

22. The apparatus of claim 21, wherein the circuitry comprises an inverter operable to invert the common logic signal for either the isolation of the plurality of second digit lines from the column decoder or the coupling of the plurality of second digit lines with the plate conductor.

23. The apparatus of claim 20, wherein each of the plurality of second transistors are configured with a first channel type, and each of the plurality of third transistors are configured with a second channel type.

24. The apparatus of claim 20, wherein each of the plurality of second transistors and each of the plurality of third transistors are configured with a same channel type.

25. The apparatus of claim 20, wherein the circuitry is operable to delay the coupling of the plurality of second digit lines with the plate conductor relative to the isolation of the plurality of second digit lines from the column decoder.

* * * * *